(12) United States Patent
Kishimoto et al.

(10) Patent No.: US 6,346,302 B2
(45) Date of Patent: *Feb. 12, 2002

(54) HIGH DENSITY PLASMA ENHANCED CHEMICAL VAPOR DEPOSITION METHOD

(75) Inventors: Koji Kishimoto; Kenichi Koyanagi, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,558

(22) Filed: Nov. 20, 1998

(30) Foreign Application Priority Data

Nov. 20, 1997 (JP) ............................... 9-319474

(51) Int. Cl.⁷ .......................... H05H 1/24; H01L 21/316
(52) U.S. Cl. ..................... 427/569; 427/579; 438/787; 438/788
(58) Field of Search ................................ 427/569, 574, 427/579; 437/787, 788; 438/732, 736, 787, 788

(56) References Cited

U.S. PATENT DOCUMENTS

| | | | | |
|---|---|---|---|---|
| 4,539,068 A | * | 9/1985 | Takagi et al. ................ | 427/570 |
| 5,272,417 A | * | 12/1993 | Ohmi ........................... | 156/345 |
| 5,340,621 A | * | 8/1994 | Matsumoto et al. .......... | 427/585 |
| 5,571,578 A | * | 11/1996 | Kaji et al. .................... | 427/579 |
| 5,591,486 A | * | 1/1997 | Okano et al. ................. | 427/576 |
| 5,593,511 A | * | 1/1997 | Foster et al. ................. | 437/238 |
| 5,792,522 A | * | 8/1998 | Jin et al. ..................... | 427/576 |
| 5,869,402 A | * | 2/1999 | Harafuji et al. .............. | 427/569 |
| 6,001,728 A | * | 12/1999 | Bhan et al. ................... | 438/789 |
| 6,016,765 A | * | 1/2000 | Numasawa et al. .......... | 156/345 |
| 6,200,412 B1 | * | 3/2001 | Kilgore et al. ............... | 438/800 |

FOREIGN PATENT DOCUMENTS

| | | |
|---|---|---|
| JP | 6-333919 | 12/1994 |
| JP | 7-321105 | 12/1995 |
| JP | 9-266207 | 10/1997 |
| JP | 10-12608 | 1/1998 |
| JP | 10-163192 | 6/1998 |

OTHER PUBLICATIONS

H.P.W. Hey et al., "Ion Bombardment: A Determining Factor in Plasma CVD", Solid State Technology, Apr. 1990, pp. 139–144.

T. Fukuda et al., "High Quality High Rate SiO2 and SiN Room Temperature Formation By Utilizing High Excited Ions", International Electron Device Meeting, Dec. 13, 1992, pp. 285–288.

* cited by examiner

Primary Examiner—Bret Chen
(74) Attorney, Agent, or Firm—Sughrue Mion, PLLC

(57) ABSTRACT

A high density plasma enhanced chemical vapor deposition method for depositing an insulating film such as a silicon oxide film on a silicon substrate includes at least both a first deposition period during which a first power having a first frequency is applied to the silicon substrate and a second deposition period during which a second power having a second frequency which is lower than the first frequency is applied to the silicon substrate to keep an underlying $Si/SiO_2$ interface free from an interface state, where said underlying $Si/SiO_2$ interface has already been formed under said insulating film.

7 Claims, 32 Drawing Sheets

HIGH DENSITY PLASMA ENHANCED CHEMICAL VAPOR DEPOSITION METHOD

BACKGROUND OF THE INVENTION

The present invention relates to an improved high density plasma enhanced chemical vapor deposition method, and more particularly to an improved high density plasma enhanced chemical vapor deposition method for depositing an inter-layer insulator or a passivation film which buries a gap of adjacent interconnections having a small distance.

Multilevel interconnections and inter-layer insulators are essential to increase a density of integration of semiconductor integrated circuits. In order to reduce a parasitic capacitance between different level interconnections and two adjacent interconnections of the same level, silicon dioxide is often used for the inter-layer insulator.

In order to realize the required size reduction, it is of course required to reduce a distance between two adjacent interconnections of the same level. In order to reduce a resistance of the interconnection, it is also required to increase a sectioned area of the interconnection. For those reasons, a high aspect ratio of a gap between two adjacent interconnections of the same level is thus required to both realize the required size reduction and reduce the resistance of the interconnection, wherein an aspect ratio is defined to be a ratio of a thickness of an interconnection layer or a height of the interconnection layer to a distance between the two adjacent interconnections of the same level. The interconnection layers are required to be buried within an insulating layer such as an inter-layer insulator or a passivation layer. This means that it is required to fill the insulating layer into the high aspect ratio gap between two adjacent interconnections of the same level.

A plasma enhanced chemical vapor deposition method for deposition of an insulating film has been in development wherein a high frequency power is applied to a silicon substrate. This plasma enhanced chemical vapor deposition method utilizes a dependency of a sputtering etching rate of argon ions upon an oblique angle, wherein the sputtering etching rate is higher efficiency to a sloped portion. This makes it possible to use the argon ion sputtering etching method to remove the insulation film on a corner of a step-shaped portion or a rectangular-shaped portion, so that the insulation film is filled into the narrow gap between the two adjacent interconnections of the same level at the same time when the insulating film is deposited. The deposition and the sputtering processes are simultaneously carried out. If a ratio of the local sputtering rate to the local deposition rate is high, it is possible to realize a required complete burying of the insulation film into an extremely narrow gap between two adjacent interconnections of the same level. In this case, however, the net deposition rate defined by a subtraction of the local sputtering rate from the local deposition rate is low. A sufficiently large net-deposition rate is necessary in order to realize the required complete burying of the insulation film into the extremely narrow gap between two adjacent interconnections of the same level.

An electron cyclotron resonance plasma enhanced chemical vapor deposition method is typical of the high density plasma enhanced chemical vapor deposition methods. These high density plasma enhanced chemical vapor deposition methods may form a high density plasma having an electron density of about $1 \times 10^{12}$ (cm−3) even under a low pressure of about several tens mTorr. The ions of the plasma under low pressure have a high directivity which permits the deposit of silicon oxide film to bury an extremely narrow gap between two adjacent interconnections of the same level, wherein the extremely narrow gap has an aspect ratio of not less than 1 and a distance between two adjacent interconnections of the same level is not higher than 0.5 micrometers. The other high density plasma enhanced chemical vapor deposition methods are, for example, a helicon wave plasma enhanced chemical vapor deposition method and an inductively coupled plasma enhanced chemical vapor deposition method. Every plasma enhanced chemical vapor deposition method is characterized by a deposition under low pressure in a reaction chamber vacuumed by a turbo molecular pump.

A chemical mechanical polishing method is also available following the above high density plasma chemical vapor deposition method whereby the insulating film is deposited to bury the extremely narrow gap between two adjacent interconnections of the same level before a surface of the deposited insulating film is then planarized.

In International Electron Device Meeting technical Digest, December 1992, pp. 285–288, entitled "High Quality High Rate $SiO_2$ and SiN Room Temperature Formation by Utilizing High Excited Ions", it is disclosed that the electron cyclotron resonance plasma enhanced chemical vapor deposition method is used to evaluate qualities of the deposited insulating films influenced by a difference in frequency of a high frequency power applied to the substrate. If the high frequency power of 400 kHz is applied to the substrate, then a wet etching rate of the silicon nitride film by a buffered fluorine acid is lower than when the high frequency power of 13.56 MHz is applied to the substrate. The fact of the low etching rate of the silicon nitride film deposited by the high density plasma enhanced chemical vapor deposition by applying the high frequency power of 400 kHz to the substrate means that the decreases in frequency of the power to be applied to the substrate for the high density plasma enhanced chemical vapor deposition results in increases in film density and quality of the deposited silicon nitride film. The mechanism of the above phenomenon is as follows. If the power of not so high frequency, for example, about 400 kHz, is applied to the substrate for the high density plasma enhanced chemical vapor deposition, then heavy ions have efficient bombardment with the insulating film. These efficient ion bombardment increases the film density of the insulating film.

In general, if the power of the very high frequency, for example, 13.56 MHz, is applied to the substrate for the high density plasma enhanced chemical vapor deposition, then electrons follow the very high frequency due to their small mass whilst ions having a relatively large mass, for example, argon ions, do not follow the very high frequency. As a result, the ions having a relatively large mass such as argon ions are simply accelerated in direct current by a potential difference between ion sheathes. Namely, under the very high frequency condition, the ions having a relatively large mass such as argon ions are dc-accelerated by a self-bias voltage which corresponds to a potential difference defined by Vp−Vt, wherein Vp is a potential of plasma with reference to the ground potential whilst Vt is a potential of a surface of the substrate with reference to the ground potential. If, however, the power of not so high frequency such as 400 kHz is applied to the substrate for the high density plasma enhanced chemical vapor deposition method, then the ions of a relatively large mass follow the not so high frequency, for which reason positive ions of a relatively large mass such as argon ions are accelerated for every half period so that the accelerated positive ions have collisions with the substrate. Much ion bombardment to the insulation film increases the film density and quality of the insulating film.

In Solid State Technology, April 1990, pp. 139–144, entitled "Ion bombardment: A Determining Factor in Plasma CVD", it is disclosed that the ions having a relatively large follow the frequency of not higher than 3MHz.

In the above circumstances, it had been required to develop a novel high density plasma enhanced chemical vapor deposition method free from the above disadvantage and problems.

SUMMARY OF THE INVENTION

Accordingly, it is an object of the present invention to provide a novel high density plasma enhanced chemical vapor deposition method free from the above problems.

It is a further object of the present invention to provide a novel high density plasma enhanced chemical vapor deposition method capable of depositing an insulating film having a high quality and a high property.

It is furthermore an object of the present invention to provide a novel high density plasma enhanced chemical vapor deposition method capable of depositing an insulating film keeping an underlying $Si/SiO_2$ interface free from an interface state, where the underlying $Si/SiO_2$ interface has already been formed under the insulating film.

It is a still further object of the present invention to provide a novel high density plasma enhanced chemical vapor deposition method capable of depositing an insulating film at a good gap filling.

It is yet a further object of the present invention to provide a novel high density plasma enhanced chemical vapor deposition method capable of depositing an insulating film which buries an extremely narrow gap of a high aspect ratio between two adjacent interconnections of the same level.

The first present invention provides a first novel high density plasma enhanced chemical vapor deposition method for depositing an insulating such as a silicon dioxide film on a silicon region such as a silicon substrate, wherein the plasma enhanced chemical vapor deposition method includes at least both a first deposition period during which a first power having a first frequency is applied to the silicon region and a second deposition period during which a second power having a second frequency which is lower than the first frequency is applied to the silicon region.

The second present invention provides a second novel method of forming an insulating film, wherein a high density plasma enhanced chemical vapor deposition is carried out to deposit an insulating film such as an $SiO_2$ film on a silicon region such as an Si substrate by applying the silicon region with a power having a frequency which is maintained in the range of not less than 1.8 MHz so as to suppress the formation of any interface state on an $Si/SiO_2$ interface having already been formed under said insulating film.

The third present invention provides a third novel high density plasma enhanced chemical vapor deposition method for depositing an insulating film such as a silicon dioxide film on a silicon region such as a silicon substrate, wherein the plasma enhanced chemical vapor deposition method is carried out by applying the silicon region with a power having a frequency which is maintained in a first high frequency range of not less than 1.8 MHz during at least an initial period of the deposition.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
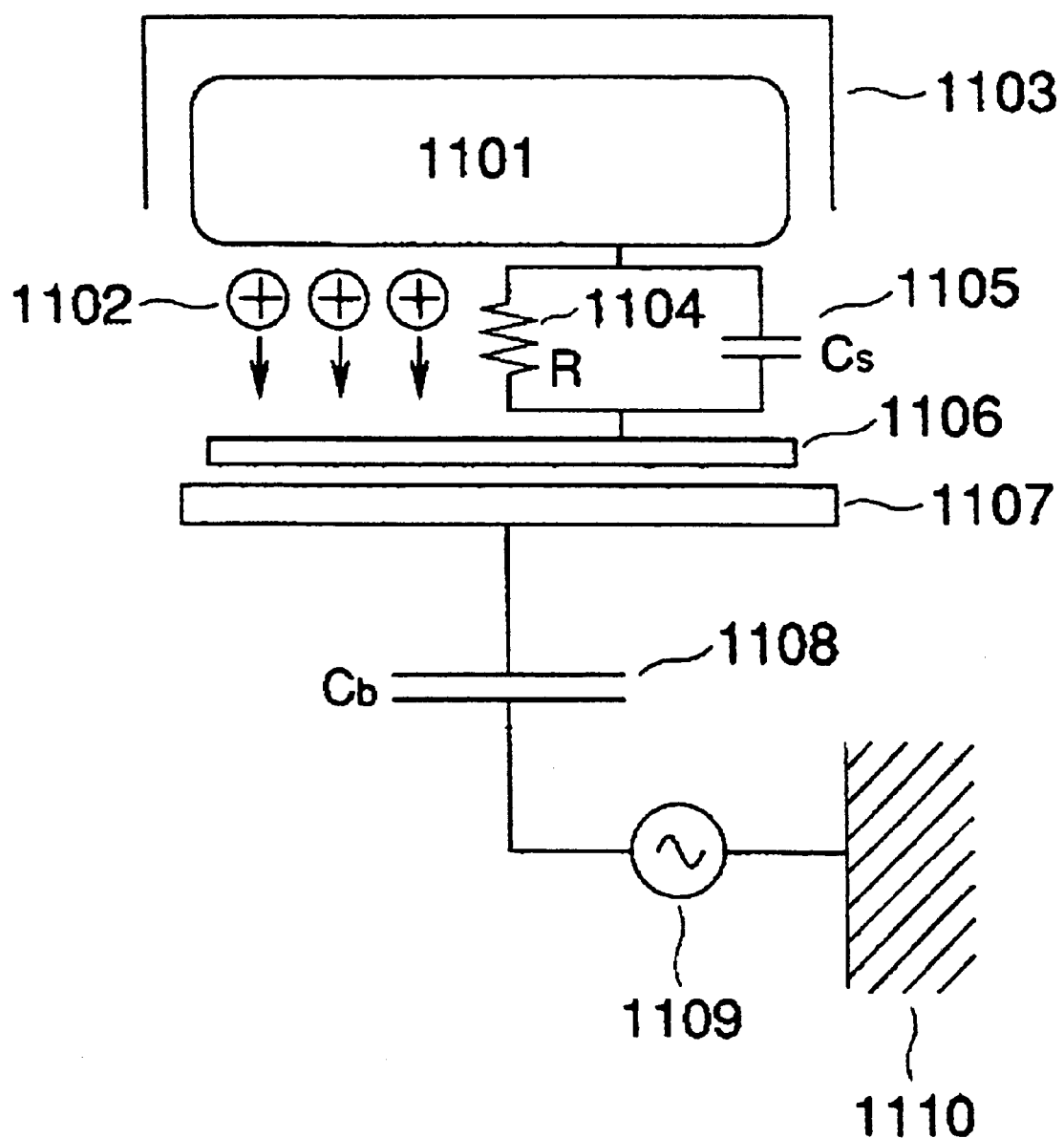
FIG. 1 is a schematic diagram illustrative in equivalent circuit of a plasma enhanced chemical vapor deposition system.

The first present invention provides a first novel high density plasma enhanced chemical vapor deposition method for depositing an insulating film such as a silicon dioxide film on a silicon region such as a silicon substrate, wherein the plasma enhanced chemical vapor deposition method includes at least both a first deposition period during which a first power having a first frequency is applied to the silicon region and a second deposition period during which a second power having a second frequency which is lower than the first frequency is applied to the silicon region.

It is preferable that the first deposition period corresponds to an initial deposition period of the high density plasma enhanced chemical vapor deposition method.

It is further preferable that the first frequency is 13.56 MHz.

It is also preferable that the substrate comprises a surface of a silicon substrate.

It is further preferable that a plurality of interconnections are formed on an insulating film on a surface of said silicon region with gaps in the range of 0.2 micrometers to 0.5 micrometers having a maximum aspect ratio in the range of 1.0 to 3.0 between two adjacent interconnections.

The second present invention provides a second novel method of forming an insulating film, wherein a high density plasma enhanced chemical vapor deposition is carried out to deposit an insulating film such as an $SiO_2$ film on a silicon region such as an Si substrate by applying the silicon region with a power having a frequency which is maintained in the range of not less than 1.8 MHz so as to suppress formation of any interface state on an $Si/SiO_2$ interface having already been formed under said insulating film.

It is preferable that the high density plasma enhanced chemical vapor deposition is carried out by use of a source gas which includes hydrogen.

It is also preferable that the frequency is fixed during the formation of the insulating film.

It is further preferable that the frequency is 13.56 MHz.

It is also preferable that the frequency is varied during the formation of the insulating film.

The third present invention provides a third novel high density plasma enhanced chemical vapor deposition method for depositing an insulating film such as a silicon dioxide film on a silicon region such as a silicon substrate, wherein the plasma enhanced chemical vapor deposition method is carried out by applying the silicon region with a power having a frequency which is maintained in a first high frequency range of not less than 1.8 MHz during at least an initial period of the deposition.

It is preferable that the frequency of the power is maintained in the first high frequency range until an end of the deposition.

It is also preferable that the frequency of the power is fixed at 13.56 MHz.

It is also preferable that the frequency of the power is continuously decreased from the first frequency range after the initial period of the deposition.

It is further preferable that the frequency of the power is simply decreased.

It is also preferable that the frequency of the power is once continuously decreased before the frequency of the power is increased.

It is also preferable that the frequency of the power is discontinuously decreased from the first frequency range after the initial period of the deposition.

It is also preferable that the frequency of the power is once discontinuously decreased before the frequency of the power is increased.

It is also preferable that the high density plasma enhanced chemical vapor deposition is carried out by use of a source gas which includes hydrogen.

It is also preferable that a plurality of interconnections are formed on an insulating film on a surface of the silicon region with gaps in the range of 0.2 micrometers to 0.5 micrometers having a maximum aspect ratio in the range of 1.0 to 3.0 between two adjacent interconnections.

For realizing the above first to third novel high density plasma enhanced chemical vapor deposition methods, an inductively coupled plasma enhanced chemical vapor deposition method may be available.

For deposition of the silicon dioxide film, reactions gases including silane, oxygen and argon may be used.

For deposition of a fluorine-containing silicon oxide film, reaction gases including silane, silicon tetrafluoride, oxygen and argon may be used.

In Japanese laid-open patent publication No. 2-15630, it is disclosed to use a parallel plate plasma enhanced chemical vapor deposition method for depositing a silicon nitride film over a silicon substrate surface on which aluminum interconnections have already been provided. This parallel plate plasma enhanced chemical vapor deposition method for depositing the silicon nitride film is quite different from the above novel present high density plasma enhanced chemical vapor deposition method in accordance with the first to third present inventions in the following viewpoints. For stress relaxation and reduction in damage of the substrate, a passivation film is deposited by a first plasma enhanced chemical vapor deposition at a first frequency of about 13.56 MHz before a further passivation film of silicon nitride is then deposited by the second plasma enhanced chemical vapor deposition at a second frequency of, for example, 50 kHz or 400 kHz. In this case, the deposition of the silicon nitride film is carried out by use of the parallel plate plasma enhanced chemical vapor deposition method to deposit the silicon nitride film over a surface of the silicon substrate on which aluminum interconnections are formed. In this parallel plate plasma enhanced chemical vapor deposition method, a high frequency power is supplied through a blocking capacitor to a top electrode whilst a scepter of the substrate is grounded. This parallel plate plasma enhanced chemical vapor deposition method is not to apply a high frequency power to the substrate to forcibly attract ions onto the substrate surface, whereby the parallel plate plasma enhanced chemical vapor deposition method is free from the deposition and sputtering processes simultaneously carried out under the control to cause the local deposition rate to be slightly higher than the local sputtering rate for obtaining the good gap filling to bury the insulating film within the narrow gap of a high aspect ratio. The parallel plate plasma enhanced chemical vapor deposition is carried out under a pressure of, for example, a few Torr which is much higher than a pressure of the high density plasma enhanced chemical vapor deposition with applying the high frequency power to the substrate in accordance with the first, second and third present inventions, for which reason the parallel plate plasma enhanced chemical vapor deposition is disadvantageous in directivity of ions. The parallel plate plasma enhanced chemical vapor deposition has a less sputtering effect or an extremely low sputtering rate, for which reason it is difficult for the parallel plate plasma enhanced chemical vapor deposition to completely bury an insulating film within an gap of 0.5 micrometers between two adjacent interconnections of the same level on the silicon substrate surface, without formation of any void. The above Japanese publication addresses that use of the low frequency power causes the underlying layer surface to be sputtered with ions, whereby the underlying insulating film, the aluminum interconnections and the CVD silicon nitride film are charged up, resulting in variations in properties of the device. In accordance with the present invention, however, the high frequency power of, for example, 13.56 MHz is applied to the substrate for carrying out the high density plasma enhanced chemical vapor deposition of the silicon dioxide, whereby the CVD silicon oxide film is charged up at a constant potential as compared to when the low frequency power of, for example, 400 kHz is applied to the substrate. A deterioration of the gate oxide film is proportional to a total amount of charges having passed through the gate oxide film. If the low frequency power of 400 kHz is applied to the substrate, then the film quality is likely to be deteriorated. The cause of deterioration of the gate oxide film is not charge up phenomenon but is the charge having passed through the gate oxide film.

In view of the improvement in the quality of the CVD insulating film, it may be proposed to use the parallel plate plasma enhanced chemical vapor deposition system which utilize the high frequency power of 13.56 MHz and the low frequency power of 400 kHz. In this case, the scepter of the substrate is applied with the power which is not higher than one tenth of the power to be applied for the high density plasma enhanced chemical vapor deposition. Further, the density of the plasma of the high density plasma enhanced chemical vapor deposition is higher by at least two digits than the plasma density of the parallel plate plasma enhanced chemical vapor deposition. For those reasons, a large number of ions are be attracted onto the substrate. The quality or property of the silicon dioxide film deposited by the high density plasma enhanced chemical vapor deposition method is much better than the quality of the silicon dioxide film deposited by the parallel plate plasma enhanced chemical vapor deposition method. The etching rate ratio of the silicon dioxide film deposited by the parallel plate plasma enhanced chemical vapor deposition method to the thermal oxide film is extremely large, for example, about 2.5.

Consequently, the issue solved by the present invention is quite different from the issue to be solved by the parallel plate plasma enhanced chemical vapor deposition method.

The gap filling of the insulation film deposited by the biased plasma enhanced chemical vapor deposition method depends upon the ratio of the local sputtering rate to the local deposition rate. If the ratio of the local sputtering rate to the local deposition rate is high, the gap filling of the insulation film is good. In order to bury the insulating film into the narrow gap between two adjacent interconnections of the same level without formation of any void, at least any one of the following conditions is required. First, a flow rate of the reaction gas is decreased to reduce the local deposition rate. Second, a flow rate of an argon gas as an inert gas is increased relative to a flow rate of the reaction gas to increase the local sputtering rate relative to the local deposition rate. Third, a high frequency power to be applied to the substrate is increased to increase the local sputtering rate.

The above first method is disadvantageous in decreasing the net deposition rate. The above second method is disadvantageous in increasing the necessary pressure for the deposition of the insulating film whereby the increased pressure deteriorates the directivity of ions, resulting in a deterioration of the gap filling. Further, a partial pressure of an oxidizing agent such as oxygen is reduced and also argon is captured into the insulating film, for which reason the above first and second methods are also disadvantageous in that a shoulder portion of a stepped portion of the base interconnection is sputtered by argon ions. The remaining third method is also disadvantageous in variation in gap filling for the following reasons. In order to increase the sputtering effect, it is required to increase ion energy. In order to increase the ion energy, it is required to increase the speed of the ions because ions having a large momentum defined by a product of ion mass and ion speed have a high capability of sputtering the insulating film. If the high frequency power having a high frequency of about 13.56 MHz is applied to the substrate, the ions having a mass larger than electrons do not follow variations of the electric field of such high frequency of about 13.56 MHz, for which reason the ions are simply accelerated in dc-voltage by a self-bias.

It is, however, difficult to increase the self-bias Vdc in the high density plasma for the following reasons. FIG. 1 is a schematic diagram illustrative in equivalent circuit of a plasma enhanced chemical vapor deposition system. A resistance R and a capacitance Cs are connected in parallel to each other between ions sheathes or between a plasma 1101 and a substrate 1106. The capacitance Cs is further connected in series to an external blocking capacitor 1108. A self-bias Vdc is applied between the ion sheathes or between the plasma 1101 and the substrate 1106.

The frequency of the power applied to the substrate is increased thereby decreasing an impedance Z (=R/(1+jC s R) between the ion sheathes or between the plasma 1101 and the substrate 1106, whereby a current between the ion sheathes is increased, wherein the current is defined to be the number of charge particles incident into the substrate per a unit time is increased, resulting in a decrease in the dc self-bias. Since as described above the ions having a larger mass than electrons are simply accelerated by the self-bias under the condition for applying the high frequency power to the substrate, then the decrease of the selfbias results in a decease in acceleration of the ions. This, even if the power generated by a high frequency power supply 1109 to be applied to a pedestal 1107, on which the substrate 1106 is placed, remains unchanged, then the increase in frequency of the power to be applied to the pedestal 1107 results in the increase only in the number of the impact ions per a unit area and a unit time. The argon ions having a small speed or a small momentum are incapable of sputtering atoms on a sloped portion of the insulating film, for which reason the gap filling is deteriorated.

Further, in order to obtain a large self-bias Vdc, it is required that a capacitance Cb of the external blocking capacitor 1108 is sufficiently larger than the capacitance Cs. The capacitance Cs is, however, proportional to a square root of an electron density (ne) of the plasma 101, for which reason if the density of the plasma is increased, then the capacitance Cs of the capacitor 1105 comes larger than the capacitance Cb of the external blocking capacitor 1108, resulting in no increase in the speed of the accelerated ions. Under the high density plasma conditions, an unpractically large increase in the capacitance Cb of the external blocking capacitor 1108 is necessary for obtaining the large self-bias for causing the large acceleration of the ions. This means it is practically difficult to obtain the desired large self-bias by use of the blocking capacitor 1108 under the high density plasma conditions.

In other words, if, under the conditions for applying the high frequency power of 13.56 MHz to the substrate, the density of the plasma is increased whilst the substrate bias power remains unchanged, then the gap filling is deteriorated.

Even if, in order to improve the quality of the insulating film, the microwave power for causing the electron cyclotron resonant plasma is increased to increase the decomposition efficiency for increasing the density of the plasma, then the self-bias Vdc is decreased and the gap filling of the insulating film is also deteriorated. This deterioration of the gap filling of the insulating film is problem particularly when nitrogen and silane are used to deposit a silicon nitride film. Nitrogen shows little decomposition in a low density plasma in a parallel plate plasma enhanced chemical vapor deposition system but is likely to be decomposed in the high density plasma. The decomposed nitrogen is likely to be reactive. This tendency is remarkable when a total flow rate of the introduction gas is increased to increase the deposition rate, whereby the deterioration of the gap filling is also remarkable. The increase in pressure of the introduced gas makes longer a remaining time of the introduced gas in the chamber whereby the decomposition efficiency is risen to increase the density of electrons (ne). In this case, even if the substrate bias power is increased to intend to ensure the gap filling, it is difficult to improve the gap filling so long as the high frequency power of about 13.56 MHz is applied to the substrate because a part of the substrate bias power is also supplied to the plasma whereby the density of the plasma is increased.

If, however, the low frequency power of about 400 kHz is applied to the substrate, then the ions of larger mass than electrons follow variations of the electric field of about 400 kHz. An impedance Z between the ion sheathes under application of such low frequency power is lower than when the high frequency power of about 13.56 MHz is applied to the substrate. The reduction in impedance between the ion sheathes results in an increase of the self-bias Vdc. During a half period, positive ions such as argon having a larger mass than electrons are accelerated to show a large collision with the substrate.

Figure 2:
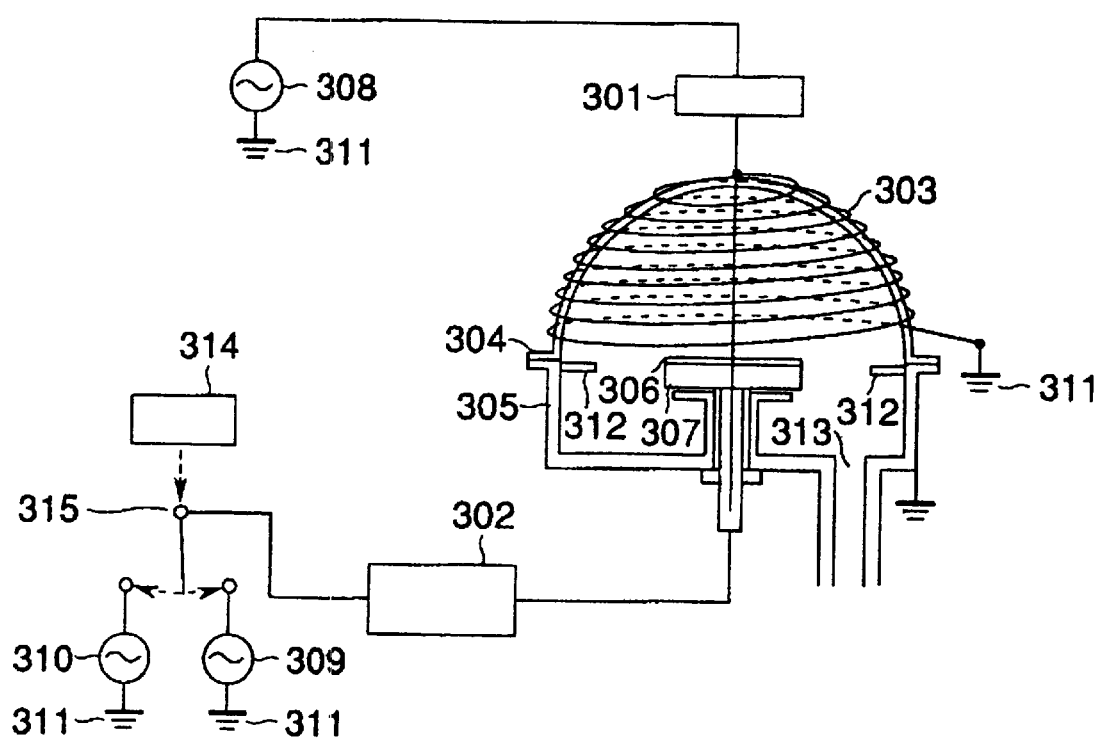
FIG. 2 is a schematic diagram illustrative of a high density plasma enhanced chemical vapor deposition system.

It was confirmed that if the frequency of the power to be applied to the substrate is lowered whilst the substrate bias power remains unchanged, then the quality or property of the deposited insulating film is improved. FIG. 2 is a schematic diagram illustrative of a high density plasma enhanced chemical vapor deposition system. Inductive coils 303 are provided which extend around a bell-jar 304. A high frequency (rf) source power is generated by a high frequency (rf) power source 308 and then applied to the inductive coils 303. A high frequency power of 13.56 MHz is generated by a first high frequency power source 309, whilst a low frequency power of 1.8 MHz is generated by a second high frequency power source 310 so that selected one of the high and low frequency powers is applied to a pedestal 307 which has a surface coated with a ceramic. A substrate 306 is chucked with an electrostatic force onto the ceramic-coated surface of the pedestal 307. A bottom surface of the substrate 306 is cooled during the deposition.

A cooling liquid is circulated throughout an internal portion of the pedestal 307 to control a growth temperature. For example, oxygen, silane and argon are supplied into the chamber at an oxygen flow rate of about 55 sccm, a silane flow rate of about 30 sccm and an argon flow rate of about 40 sccm respectively, so that an internal pressure of the chamber comes about 5.2 mTorr. A temperature of the cooling liquid and a helium pressure between the bottom surface of the silicon substrate 306 and the top surface of the pedestal 307 are controlled to set the growth temperature at about 350. A high frequency (rf) power of about 3500 W is applied to the inductive coils 303 whilst a high frequency power of about 1600 W is applied to the pedestal 307. The substrate 306 has a size of 6 inches.

Figure 3:
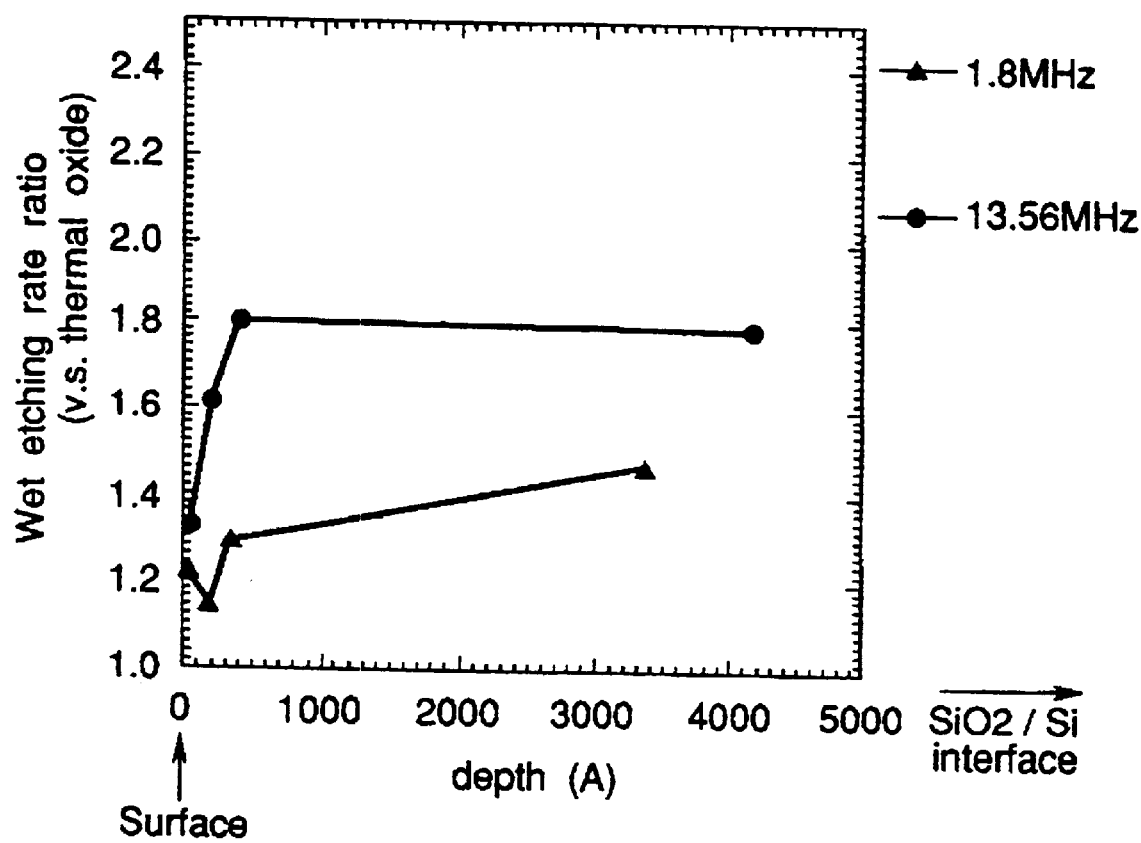
FIG. 3 is a diagram illustrative of variation in wet etching rate ratio of plasma enhanced CVD silicon oxide film with buffered fluorine acid to a thermal oxide film over depth from a surface of the CVD silicon oxide film, wherein the wet etching rate is normalized with the thermal oxide film.

FIG. 3 is a diagram illustrative of variation in wet etching rate ratio of plasma enhanced CVD silicon oxide film with buffered fluorine acid to a thermal oxide film over depth from a surface of the CVD silicon oxide film, wherein the wet etching rate is normalized with the thermal oxide film. The thermal oxide film is formed by exposing the substrate to a wet oxidation at 980. FIG. 3 shows that a surface portion of the CVD oxide film has a decreased wet etching rate ratio as compared to the remaining portion of the CVD oxide film. This means that after the deposition of the film, the film is exposed to a plasma of oxygen and argon whereby a surface of the film is oxidized before the substrate is removed from the pedestal. The CVD oxide film deposited with a low frequency power of 1.8 MHz has a lower wet etching rate ratio as compared to that of the CVD oxide film deposited with a high frequency power of 13.56 MHz.

A substrate is prepared which has aluminum interconnections separated from each other at a distance of 0.35 micrometers and by gaps of an aspect ratio of about 2. Silicon oxide films are deposited on that substrate under the same conditions as described above with reference to FIG. 3. Namely, the silicon oxide films are deposited at the different power frequencies, for example, the lower frequency power of 1.8 MHz and the higher frequency power of 13.56 MHz under the same conditions of pressure, gas components and the power. In case of the high frequency power application, voids are formed in the CVD silicon oxide film within the gaps between adjacent two of the aluminum interconnections, whilst in the low frequency power application, no void is formed.

Needless to say, if the frequency of the power to be applied to the pedestal or the substrate for the plasma enhanced chemical vapor deposition is further lowered from 1.8 MHz, then the gap filling of the CVD oxide film is further improved.

Consequently, if the low frequency power of, for example, 400 kHz is applied to the substrate, then the sputtering rate is increased proportionally to the increase in the substrate bias power whereby the gap filling is improved by increasing the substrate bias power. If, however, the high frequency power of, for example, 13.56 MHz is applied to the substrate, then the sputtering rate is insufficiently increased even by a large increase in the substrate bias power whereby it is difficult to improve the gap filling by increasing the substrate bias power.

The foregoing descriptions show that the low frequency power application to the substrate seems preferable to obtain the high density CVD oxide film with the good gap filling property. However, this low frequency power application to the substrate for the high density plasma chemical vapor deposition method causes a problem with a plasma damage to an underlying transistor, wherein the plasma damage is not a damage due to no uniformity of plasma and is a damage caused even in a uniform plasma. Namely, this damage is remarkable particularly when the semiconductor device is scaled down.

Figure 4:
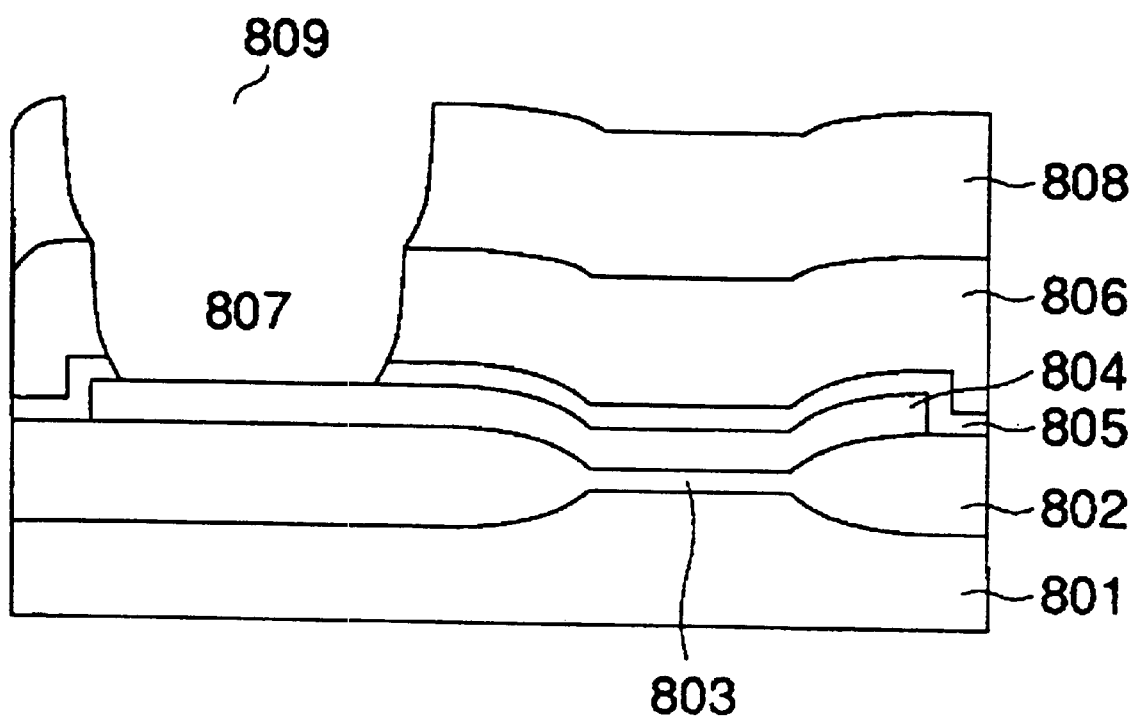
FIG. 4 is a fragmentary cross sectional elevation view illustrative of a MOS structure for evaluation of an interface state density of $SiO_2/Si$ interface to evaluate the plasma damage.
Figure 5:
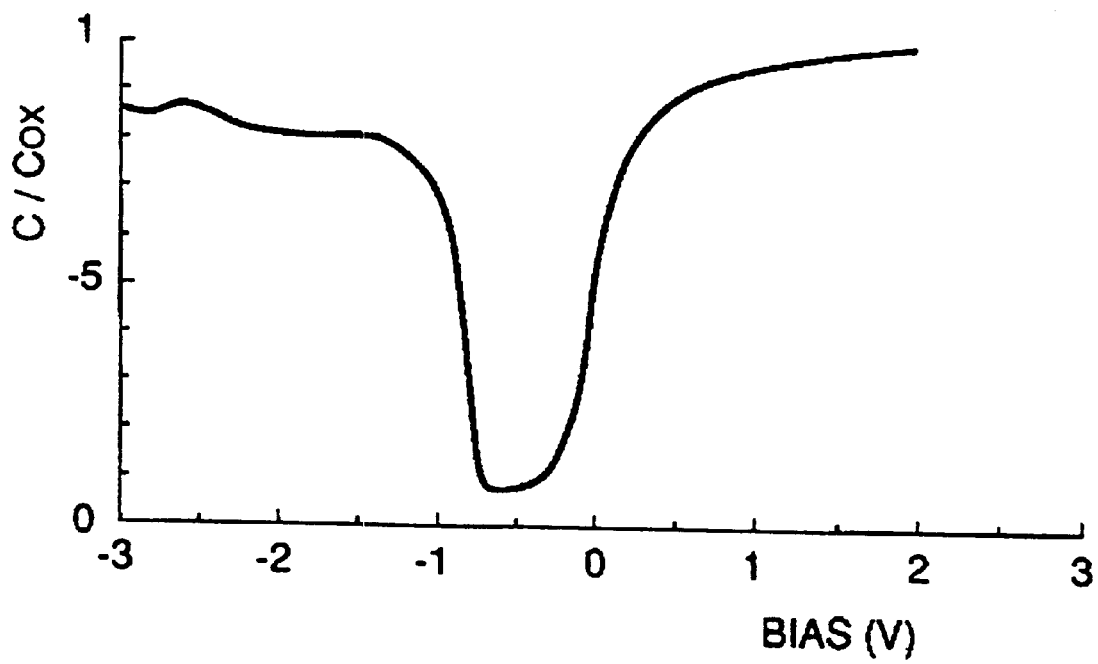
FIG. 5 is a diagram illustrative of variations in semi-static capacitance over bias voltage for the MOS structure using the silicon oxide film deposited by the high density plasma enhanced chemical vapor deposition method with application of the high frequency power of 13.56 MHz to the Si substrate.
Figure 6:
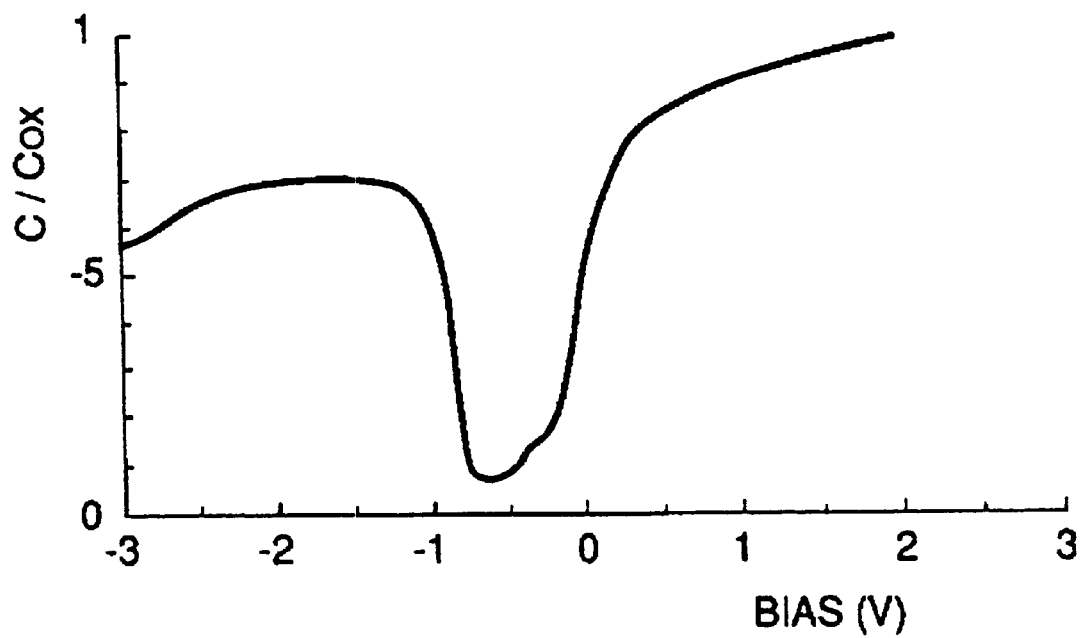
FIG. 6 is a diagram illustrative of variations in semi-static capacitance over bias voltage for the MOS structure using the silicon oxide film deposited by the high density plasma enhanced chemical vapor deposition method with application of the low frequency power of 1.8 MHz to the Si substrate.

FIG. 4 is a fragmentary cross sectional elevation view illustrative of a MOS structure for evaluation of an interface state density of $SiO_2/Si$ interface to evaluate the plasma damage. Field oxide films 802 are formed on a surface of a silicon substrate 801 to define an active substrate so that a gate oxide film 803 is formed for subsequent deposition of a polysilicon film before phosphorus is thermally diffused into the deposited polysilicon to carry out a normal patterning method to define a polysilicon gate 804 which covers the gate oxide film 803. An atmospheric chemical vapor deposition method is carried out to deposit a silicon oxide film 805. A boro-phospho-silicate-glass film 806 doped with boron and phosphorus is formed on the silicon oxide film 805 and then re-flowed by a heat treatment at 850 in a nitrogen atmosphere. A first opening 807 is formed in the boro-phospho-silicate-glass film 806 and the silicon oxide film 805 by use of a photo-lithography technique and a subsequent wet etching method. At this stage, a semi-static capacitance-voltage is measured to confirm that an interface state is sufficiently low on an interface between the gate oxide film 803 and the silicon substrate 801. Subsequently, a high density plasma enhanced chemical vapor deposition method is carried out to entirely deposit a silicon oxide film 808. A second opening 809 is formed in the CVD silicon oxide film 808 by use of the photo-lithography technique and the subsequent wet etching method so that the second opening 809 is positioned over the first opening 807 so that a part of the surface of the polysilicon gate 804 is shown through the first and second openings 807 and 809. The above silicon substrate is an n-type silicon substrate. The silicon oxide film 808 has a thickness of about 1 micrometers. The gate oxide film 803 on the active substrate surrounded by the field oxide films 802 has an area of 2.5×10-3 $cm^2$. The first opening 807 also has the same area of 2.5×10-3 $cm^2$. A semi-static capacitance-voltage is measured to confirm the following facts. FIG. 5 is a diagram illustrative of variations in semi-static capacitance over bias voltage of the silicon oxide film deposited by the high density plasma enhanced chemical vapor deposition method with application of the high frequency power of 13.56 MHz. FIG. 6 is a diagram illustrative of variations in semi-static capacitance over bias voltage of the silicon oxide film deposited by the high density plasma enhanced chemical vapor deposition method with application of the low frequency power of 1.8 MHz. If the low frequency power of 1.8 MHz is applied to the substrate, then a convex portion appears on the capacitance-voltage curve in the range of the bias voltage from–0.5V to–0.2V. Namely, the capacitance-voltage curve is increased from the ideal capacitance-voltage curve in the range of the bias voltage from–0.5 V to –0.2 V. This means generation of interface state on the $SiO_2/Si$ interface. Namely, if the low frequency power of, for example, 400 kHz is applied to the substrate to carry out the high density plasma chemical vapor deposition, then the interface state is formed on the $SiO_2/Si$ interface. On the other hand, if the high frequency power of 13.56 MHz is applied to the substrate, then the density of the interface state almost remains unchanged from the initial density before the deposition even the substrate bias power is the same. Although the above phenomenon appears in case of the p-type silicon substrate, a discrepancy of the measured capacitance-voltage curve from the ideal capacitance-voltage curve is larger in case of the n-type silicon substrate. In view of suppression of generation of the interface state, it is preferable to apply the high frequency power of 13.56 MHz to the substrate.

Figure 7A:
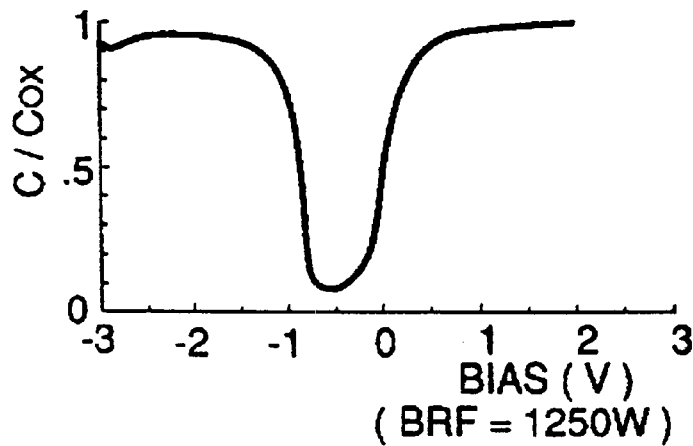
FIG. 7A is a diagram illustrative of variations in semi-static capacitance over bias voltage for the MOS structure using the silicon oxide film deposited by the high density plasma enhanced chemical vapor deposition method with application of the low frequency power of 1.8 MHz and 1250 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and increase in flow rate of silane as increase of the power and at a constant temperature of 350 controlled by controlling a helium pressure between the bottom surface of the silicon substrate and the top surface of the pedestal.
Figure 7B:
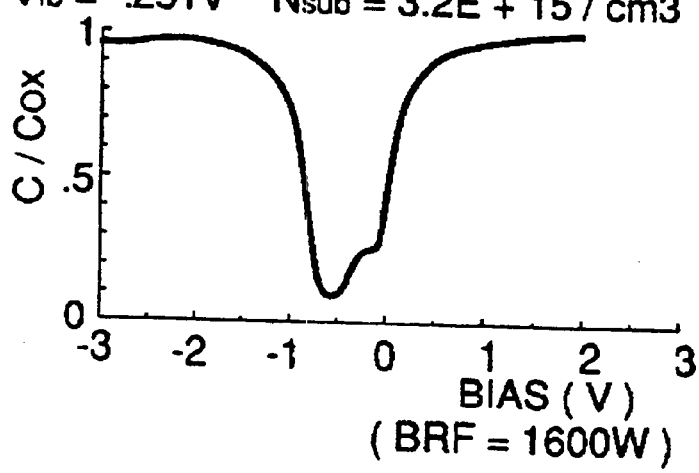
FIG. 7B is a diagram illustrative of variations in semi-static capacitance over bias voltage for the MOS structure using the silicon oxide film deposited by the high density plasma enhanced chemical vapor deposition method with application of the low frequency power of 1.8 MHz and 1600 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and increase in flow rate of silane as increase of the power and at a constant temperature of 350 controlled by controlling a helium pressure between the bottom surface of the silicon substrate and the top surface of the pedestal.
Figure 7C:
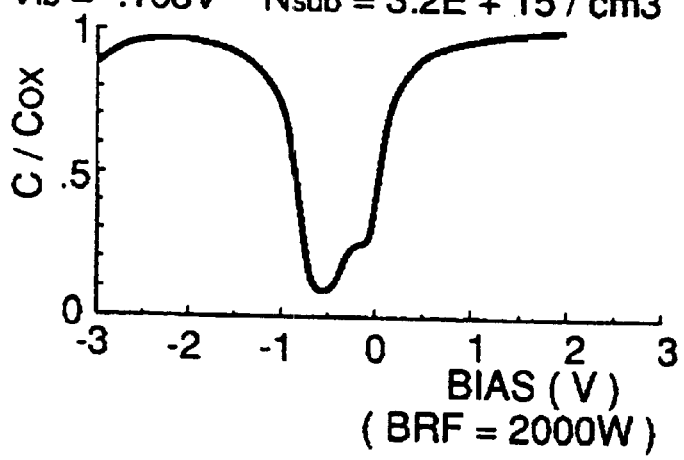
FIG. 7C is a diagram illustrative of variations in semi-static capacitance over bias voltage for the MOS structure using the silicon oxide film deposited by the high density plasma enhanced chemical vapor deposition method with application of the low frequency power of 1.8 MHz and 2000 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and increase in flow rate of silane as increase of the power and at a constant temperature of 350 controlled by controlling a helium pressure between the bottom surface of the silicon substrate and the top surface of the pedestal.
Figure 8A:
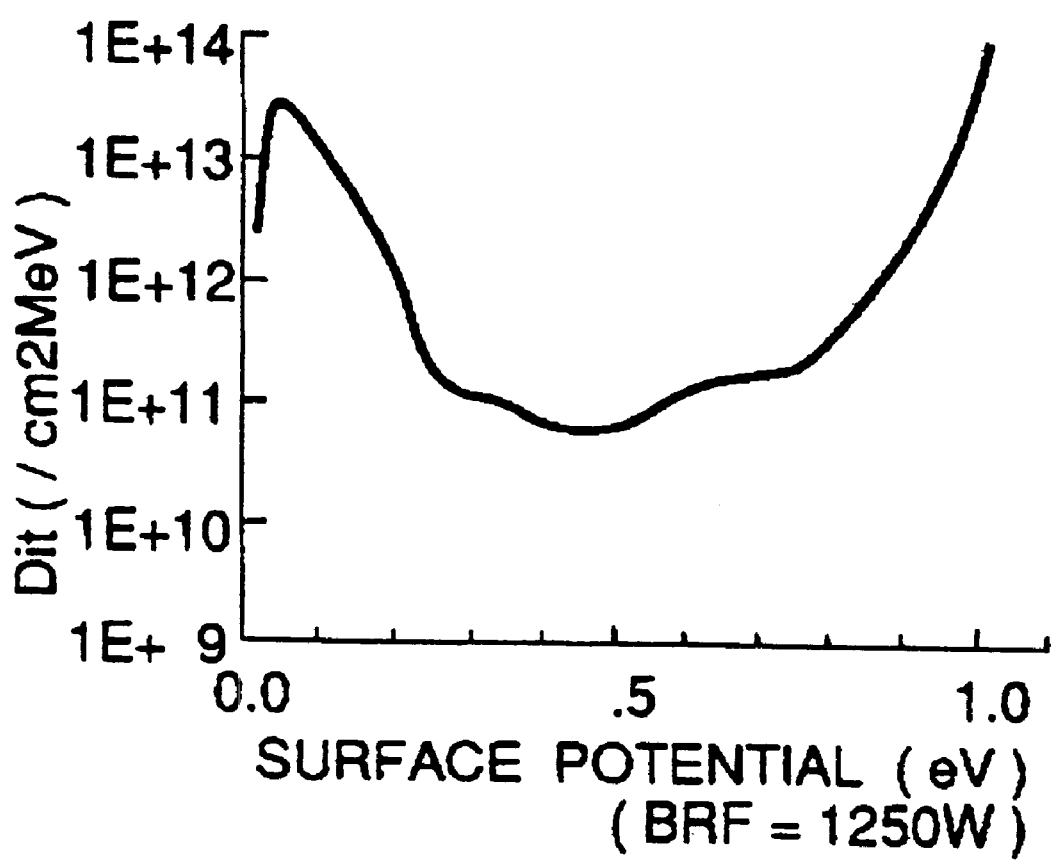
FIG. 8A is a diagram illustrative of variations in density of the interface state of $SiO_2/Si$ interface using the CVD silicon oxide film deposited under the conditions of FIG. 7A, wherein the density of the interface state is calculated from the discrepancy of the measured capacitance-voltage curve of FIG. 7A from the ideal capacitance-voltage curve.
Figure 8B:
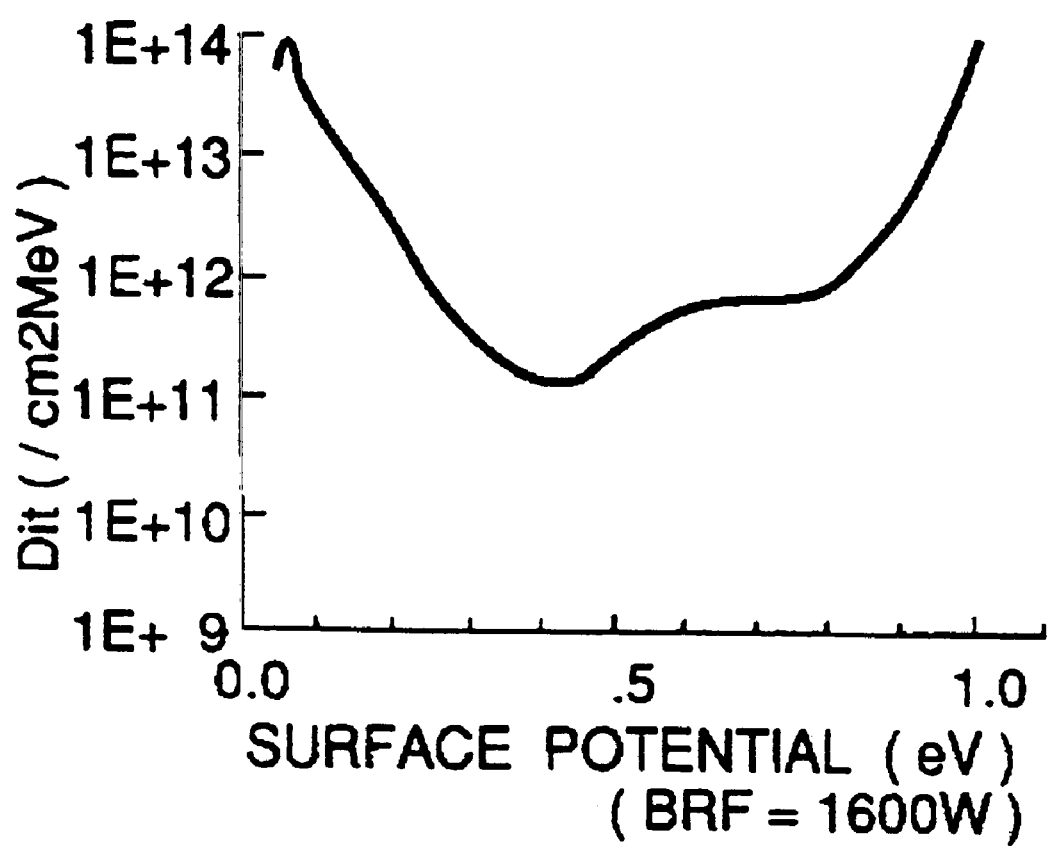
FIG. 8B is a diagram illustrative of variations in density of the interface state of $SiO_2/Si$ interface using the CVD silicon oxide film deposited under the conditions of FIG. 7B, wherein the density of the interface state is calculated from the discrepancy of the measured capacitance-voltage curve of FIG. 7B from the ideal capacitance-voltage curve.
Figure 8C:
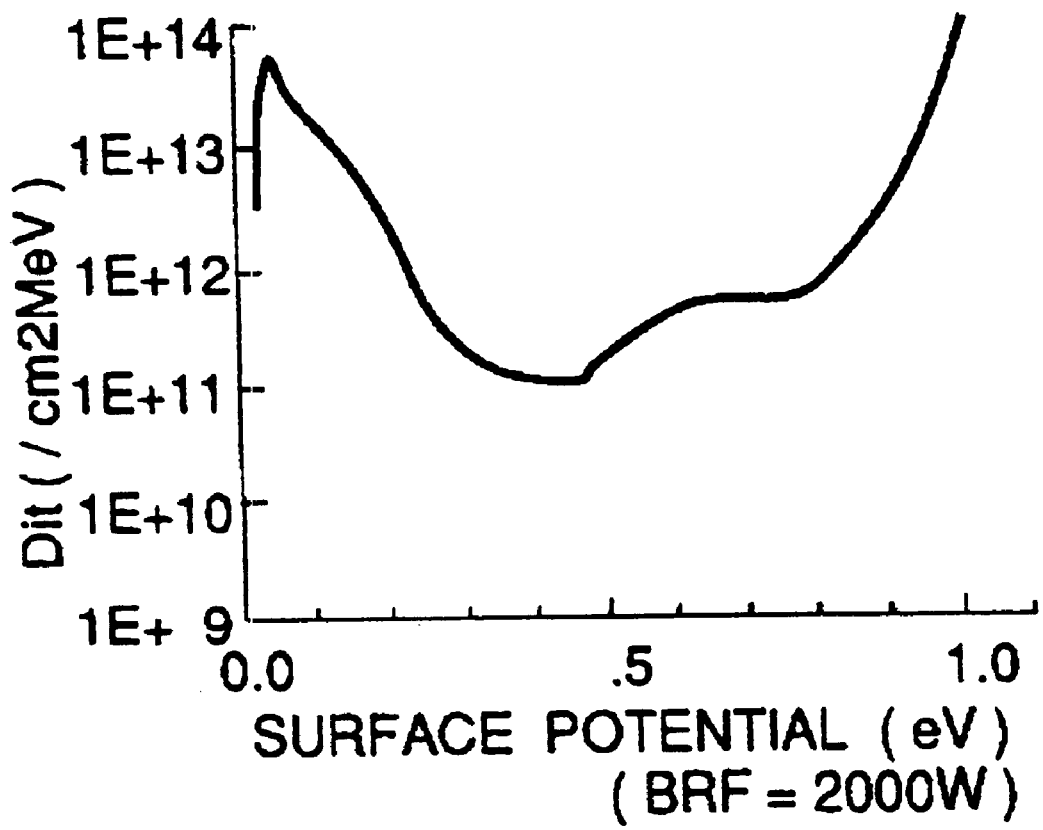
FIG. 8C is a diagram illustrative of variations in density of the interface state of $SiO_2/Si$ interface using the CVD silicon oxide film deposited under the conditions of FIG. 7C, wherein the density of the interface state is calculated from the discrepancy of the measured capacitance-voltage curve of FIG. 7C from the ideal capacitance-voltage curve. The interface state density is most accurate in the vicinity of a mid-gap, for example, the surface potential center and the accuracy of the interface state density is deteriorated as being distanced from the center.
Figure 9:
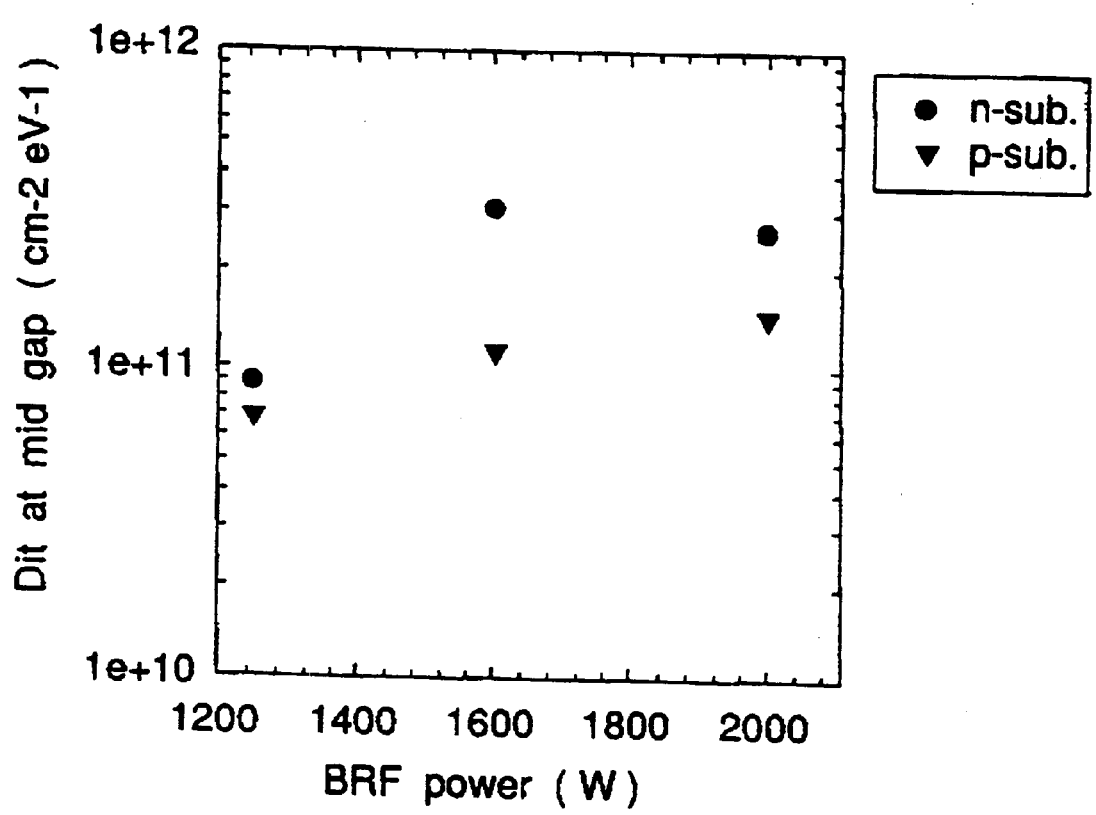
FIG. 9 is a diagram illustrative of variations of interface state densities at the mid-gap over the substrate bias power.

FIG. 7A is a diagram illustrative of variations in semi-static capacitance over bias voltage of the silicon oxide film deposited by the high density plasma enhanced chemical vapor deposition method with application of the low frequency power of 1.8 MHz and 1250 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and constant net deposition rate by increasing flow rate of silane as increase of the power and at a constant temperature of 350 controlled by controlling a helium pressure between the bottom surface of the silicon substrate and the top surface of the pedestal. FIG. 7B is a diagram illustrative of variations in semi-static capacitance over bias voltage of the silicon oxide film deposited by the high density plasma enhanced chemical vapor deposition method with application of the low frequency power of 1.8 MHz and 1600 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and constant net deposition rate by increasing flow rate of silane as increase of the power and at a constant temperature of 350 controlled by controlling a helium pressure between the bottom surface of the silicon substrate and the top surface of the pedestal. FIG. 7C is a diagram illustrative of variations in semi-static capacitance over bias voltage of the silicon oxide film deposited by the high density plasma enhanced chemical vapor deposition method with application of the low frequency power of 1.8 MHz and 2000 W to the n-type silicon substrate of 6 inches, wherein a silicon oxide film having a thickness of about 1 micrometer is deposited by the high density plasma enhanced chemical vapor deposition method with constant flow rate ratio of 1.4 of oxygen to silane and constant net deposition rate by increasing flow rate of silane as increase of the power and at a constant temperature of 350 controlled by controlling a helium pressure between the bottom surface of the silicon substrate and the top surface of the pedestal. FIG. 8A is a diagram illustrative of variations in density of the interface state of $SiO_2$/Si interface using the CVD silicon oxide film deposited under the conditions of FIG. 7A, wherein the density of the interface state is calculated from the discrepancy of the measured capacitance-voltage curve of FIG. 7A from the ideal capacitance-voltage curve. FIG. 8B is a diagram illustrative of variations in density of the interface state of $SiO_2$/Si interface using the CVD silicon oxide film deposited under the conditions of FIG. 7B, wherein the density of the interface state is calculated from the discrepancy of the measured capacitance-voltage curve of FIG. 7B from the ideal capacitance-voltage curve. FIG. 8C is a diagram illustrative of variations in density of the interface state of $SiO_2$/Si interface using the CVD silicon oxide film deposited under the conditions of FIG. 7C, wherein the density of the interface state is calculated from the discrepancy of the measured capacitance-voltage curve of FIG. 7C from the ideal capacitance-voltage curve. The interface state density is most accurate in the vicinity of a mid-gap, for example, the surface potential center and the accuracy of the interface state density is deteriorated as being distanced from the center. If the low frequency power of 1.8 MHz is applied to the substrate, then the increase of the substrate bias power results in a simple increase in the interface state density in the vicinity of the mid-gap. FIG. 9 is a diagram illustrative of variations of interface state densities at the mid-gap over the substrate bias power.

In case of the low frequency power of 1.8 MHz, the density of the interface state between the gate oxide film and each of the n-type and p-type silicon substrate is simply increased by increasing the substrate bias power. The interface states are once disappeared by a heat treatment with a hydrogen foaming gas. Notwithstanding, when a voltage is applied to the polysilicon gate to apply a current stress to the gate oxide film, the interface states are again formed. This phenomenon means that driving the transistor changes the threshold voltage from the initial value, whereby the reliability of the semiconductor device is deteriorated.

On the other hand, if the high frequency power of 13.56 MHz is applied to the substrate, then there appears almost no formation of the interface state due to plasma damage as shown in FIG. 5.

If the low frequency power of, for example, 400 kHz is applied to the substrate, then the positive ions having a larger mass than electrons follow variations of the electric field of 400 kHz, whereby the ions as the positive charges and electrons as the negative charges are alternately attracted to the substrate in every the half period. This means that a total amount of the positive and negative charges passing through the gate oxide film is increased. If, however, the high frequency power of, for example, 13.56 MHz is applied to the substrate, then the positive ions having a larger mass than electrons do not follow variations of the electric field of 13.56 MHz, whereby only electrons as the negative charges are attracted to the substrate. As a result, the surface of the substrate is negatively charged at a constant potential. After the surface of the substrate has once been charged at the potential, the same amount positive and negative charges arrive onto the surface of the substrate, for which reason no current flows through the gate oxide film.

Further, the application of the low frequency power to the substrate causes a reduction in a charge to breakdown Qbd of the gate oxide film, wherein the charge to breakdown Qbd is a total amount of charges having flowed through the gate oxide film until a break down appears to the gate oxide film. The reduction in the charge to breakdown Qbd means that a total amount of charges has flowed through the gate oxide film prior to the measurement and also means that the density of the interface state is increased. Namely, when the charges passed through the gate oxide film, the interface states are formed on the interface between the silicon substrate and the gate oxide film, whereby the reliability and durability of the gate oxide film are also deteriorated.

The above disadvantages with the low frequency power application are more remarkable when the power frequency is lower than the above frequency.

The above present invention is intended to realize a possible reduction or suppression of formation of the interface state on the interface between silicon substrate and gate oxide film rather than obtain a possible improvement in step coverage of the silicon oxide film.

It was confirmed by the present inventors that the high frequency of not less than 1.8 MHz of the power to be applied to the substrate for carrying out the high density plasma enhanced chemical vapor deposition method using a source gas including hydrogen is essential for forming the interface between silicon substrate and gate oxide film without formation of interface states. In the prior art, it was presumed or considered that the high frequency of about 1.0 MHz of the power to be applied to the substrate is available to form the interface state free interface between silicon substrate and gate oxide film. Actually, however, it was confirmed by the present inventors that if the high frequency power of about 1.0 MHz is applied to the substrate, then hydrogen ions in the plasma could follow the variations in electric field of the frequency of about 1.0 MHz because the hydrogen ion mass is smaller than other positive ions, for which reason electrons and hydrogen ions are alternately capable of passing through the gate oxide film and the $Si/SiO_2$ interface, for which reason the total amount of the charges capable of passing through the gate oxide film and the $Si/SiO_2$ interface is larger than when only electrons could follow the variations in electric field. However, if the frequency of the power to be applied to the substrate is increased to about 3 MHz, then the hydrogen ions could no longer follow the variations in electric field whilst only electrons could follow the variations in electric field, whereby the total amount of charges capable of passing through the gate oxide film and through the $Si/SiO_2$ interface is reduced to less than a half. As a result, the formations of the interface state on the Si/SiO$_2$ interface is remarkably suppressed. For the present invention, it is more important to reduce the interface state on the Si/SiO$_2$ interface rather than improve the gap filling of the CVD silicon oxide film.

It will be described more concretely how to realize or practice the present invention as follows.

With reference again to FIG. 2, the inductively coupled plasma enhanced chemical vapor deposition system will be described which is available to realize the novel high density plasma enhanced chemical vapor deposition method in accordance with the present invention. Any one of the high frequency power source 309 and the low frequency power source 310 is selectable to apply a selected one of high and low frequency powers to the pedestal 307 on which the substrate 306 is electrostatic-chucked. Process gases including oxygen and argon are introduced through a gas introduction port 312 into the reaction chamber whilst a discharge through a vacuum discharge port 313 by a turbo molecular pump is made to control an internal pressure of the chamber at not higher than several tens mTorr. A high frequency power generated by a high frequency (rf) power source 308 is applied through an automatic matching box 301 to the inductive coils 303, so that the power is transmitted from the inductive coils 303 through the bell-jar 304 to the plasma. Further, a selected one of the high and low frequency powers generated by the high frequency power source 309 and the low frequency power source 310 is applied through both the automatic matching box 302 and a switch 315 to the pedestal 307 so that the selected one of the high and low frequency powers is applied to the substrate 306 on the pedestal 307. The operation of the switch 315 is controlled by a controller 314. Excited ions and radicals from the introduced process gases are attracted onto the surface of the substrate 306 applied with the selected one of the high and low frequency powers to deposit the silicon oxide film on the silicon substrate 306.

The pedestal 307 is made of a conductive material and a surface of the pedestal 307 is coated with an insulating film such as alumina. The pedestal 307 is controlled in temperature by circulating a cooling liquid through an interior of the pedestal 307. A surface of the pedestal 307 has shallow grooves so that helium is filled in the grooves. A pressure of the helium is controlled to control a temperature of the surface of the substrate 306 at less than 500 during the deposition process.

Figure 10:
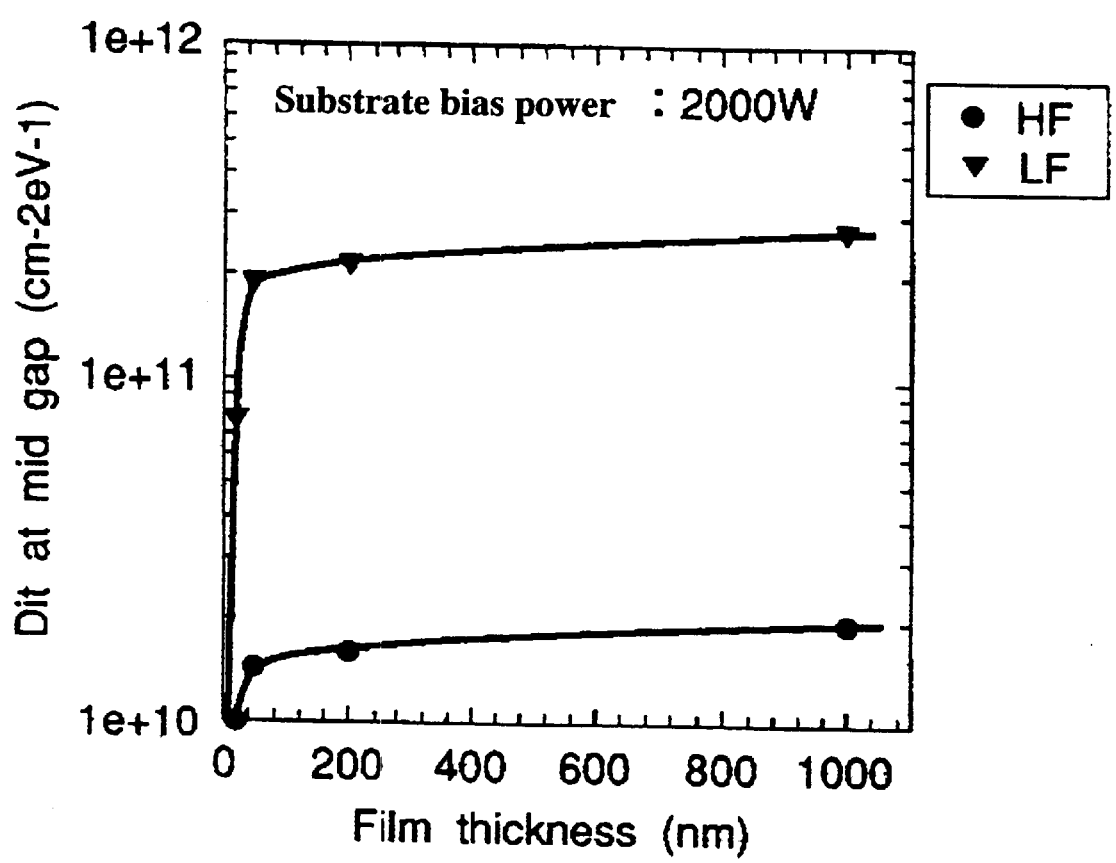
FIG. 10 is a diagram illustrative of variations of interface state density at mid-gap over film thickness of the CVD silicon oxide film deposited by the high density plasma enhanced chemical vapor deposition method, wherein a constant high frequency power of 2000 W is applied to the substrate.

An evaluation of the plasma damage is made through the variations in interface state density of the Si/SiO$_2$ interface by use of the polysilicon gate MOS structure illustrated in FIG. 4. FIG. 10 is a diagram illustrative of variations in interface state density at mid-gap over film thickness of the CVD silicon oxide film using the high density plasma enhanced chemical vapor deposition method, wherein a constant high frequency power of 2000 W is applied to the substrate with either a high or low frequency (HF or LF). The thickness of the film is varied whilst the silicon oxide film deposition conditions are fixed as follows. Oxygen is introduced into the chamber at a flow rate of about 55 sccm. Silane is also introduced at a flow rate of about 39 sccm. Argon is also introduced at a flow rate of about 55 sccm. An internal pressure of the chamber is set at about 5.2 mTorr. The temperature of the cooling liquid and the pressure of the helium are controlled to set a growth temperature at about 350. A high frequency (rf) power of 3500 W is applied to the inductive coils whilst the above high frequency (HF or LF) power of 2000 W is applied to the pedestal. The substrate has 6 inches size. The above low frequency (LF) is 1.8 MHz whilst the above high frequency (HF) i s 13.56 MHz.

Figure 11:
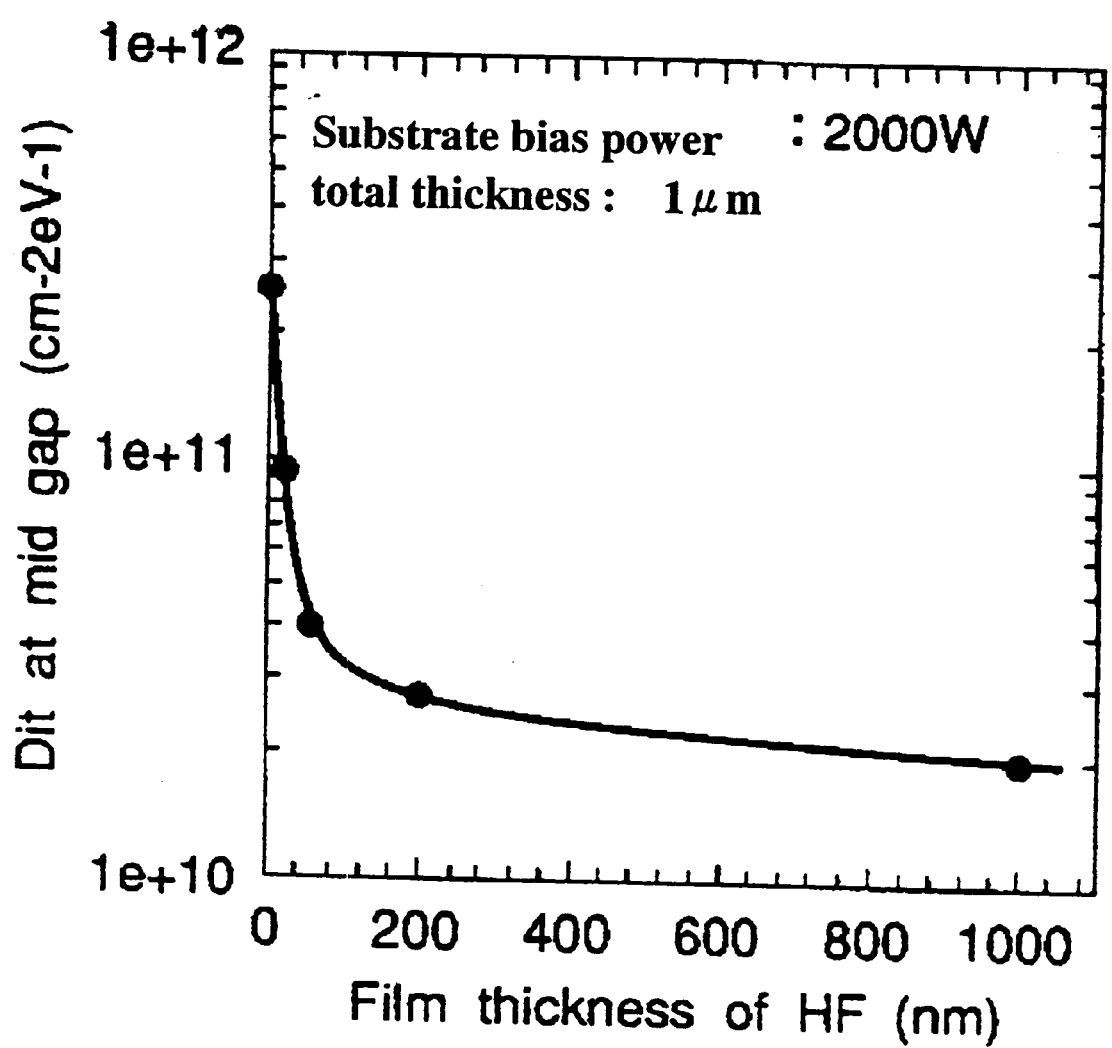
FIG. 11 is a diagram illustrative of variations of interface state density at mid-gap over film thickness of the base silicon oxide film deposited by the high density plasma enhanced chemical vapor deposition method, wherein the base silicon oxide film is deposited by applying a high frequency power to the substrate and subsequently an overlaying silicon oxide film is then deposited by applying a lower frequency power to the substrate so that a total thickness of the base silicon dioxide film and the overlaying silicon dioxide film is fixed at 1000 nanometers.

If the low frequency power of 1.8 MHz is applied to the substrate, then the interface state density is rapidly increased as the thickness of the CVD silicon oxide film is increased to about 100 nanometers, whilst the interface state density is gradually increased as the thickness of the CVD silicon oxide film is further increased from about 100 nanometers. The phenomenon of current through the gate oxide film appears in the initial time period. If the high frequency power of 13.56 MHz is applied to the substrate, then the interface state density is well suppressed even the thickness of the CVD silicon oxide film is increased to about 1000 nanometers. FIG. 11 is a diagram illustrative of variations in interface state density at mid-gap over film thickness of the CVD silicon oxide film using the high density plasma enhanced chemical vapor deposition method, wherein a base silicon oxide film is deposited by applying a high frequency power to the substrate and subsequently an overlaying silicon oxide film is then deposited by applying a lower frequency power to the substrate so that a total thickness of the base silicon dioxide film and the overlaying silicon dioxide film is fixed at 1000 nanometers. The base silicon dioxide film having a thickness of only 50 nanometers deposited by the application high frequency power to the substrate could sufficiently suppress the formation of the interface state density and also suppress the plasma damage.

PREFERRED EMBODIMENTS

First Embodiment

A first embodiment according to the present invention will be described in detail with reference to FIGS. 12A through 12F which are fragmentary cross sectional elevation views illustrative of a novel method of forming an inter-layer insulator in a multilevel interconnection structure by use of the novel high density plasma enhanced chemical vapor deposition method.

Figure 12A:
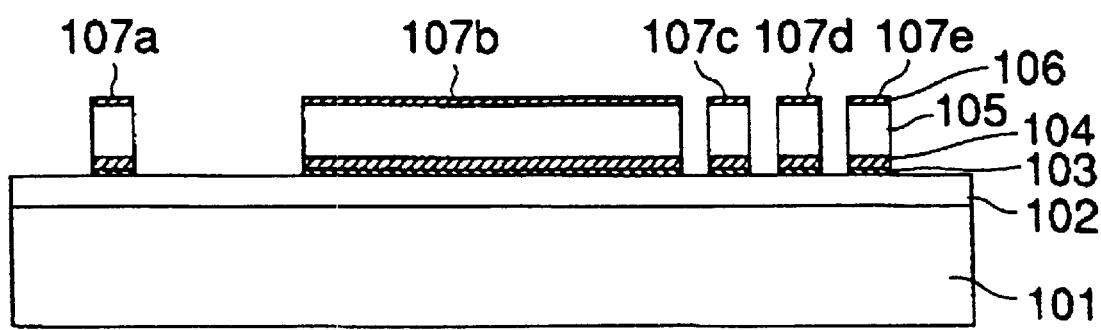
FIGS. 12A through 12F are fragmentary cross sectional elevation views illustrative of a novel method of forming an inter-layer insulator in a multilevel interconnection structure by use of the novel high density plasma enhanced chemical vapor deposition method in a first embodiment.

With reference to FIG. 12A, a boro-phospho-silicate glass film as a base insulating layer is entirely deposited on a surface of a silicon substrate 101 for subsequent curing by a rapid thermal annealing method thereby to form a base insulating film 102 on the silicon substrate 101. Contact holes not illustrated are formed in the base insulating film 102. A titanium film 103 having a thickness of about 30 nanometers is deposited by a sputtering method on a surface of the base insulating film 102. A titanium nitride film 104 having a thickness of about 130 nanometers is then deposited by the sputtering method on a surface of the titanium film 103. Further, an aluminum-copper alloy film 105 having a thickness of about 450 nanometers is then deposited by the sputtering method on a surface of the titanium nitride film 104. A titanium nitride film 106 having a thickness of about 50 nanometers is then deposited by the sputtering method on a surface of the aluminum-copper alloy film 105, thereby forming a layered metal film having a thickness of about 660 nanometers on the base insulating film 102. The layered metal film is patterned by the known method to form first level interconnections 107a, 107b, 107c, 107d, and 107e. A minimum space between the adjacent interconnections is 0.35 micrometers. The minimum space has an aspect ratio of 1.9.

Figure 12B:
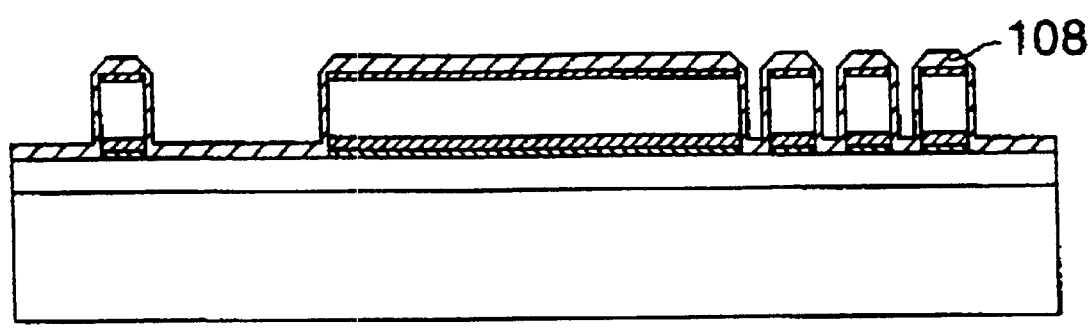

With reference to FIG. 12B, the inductively coupled plasma enhanced chemical vapor deposition system of FIG. 2 is used to carry out a first high density plasma enhanced chemical vapor deposition to deposit a first silicon dioxide film 108 having a thickness of about 70 nanometers on the first level interconnections 107a, 107b, 107c, 107d, and 107e and on the base insulating film 102. This first high density plasma enhanced chemical vapor deposition is carried out using silane, oxygen and argon gases with application of a high frequency power of 13.56 MHz to the substrate 101. A power of about 3000 W is generated by the high frequency (rf) power source 308 whilst a power of about 1300 kW to be applied to the silicon substrate 101 is generated by the high frequency power source 309. An internal pressure of the chamber is set at about 6 mTorr. A flow rate ratio of oxygen to silane is about 1.4. The pedestal 307 is cooled to maintain the substrate temperature at about 350. The deposited first silicon dioxide film 108 has slightly overhang portions at shoulder portions of the first level interconnections 107a, 107b, 107c, 107d, and 107e.

Figure 12C:
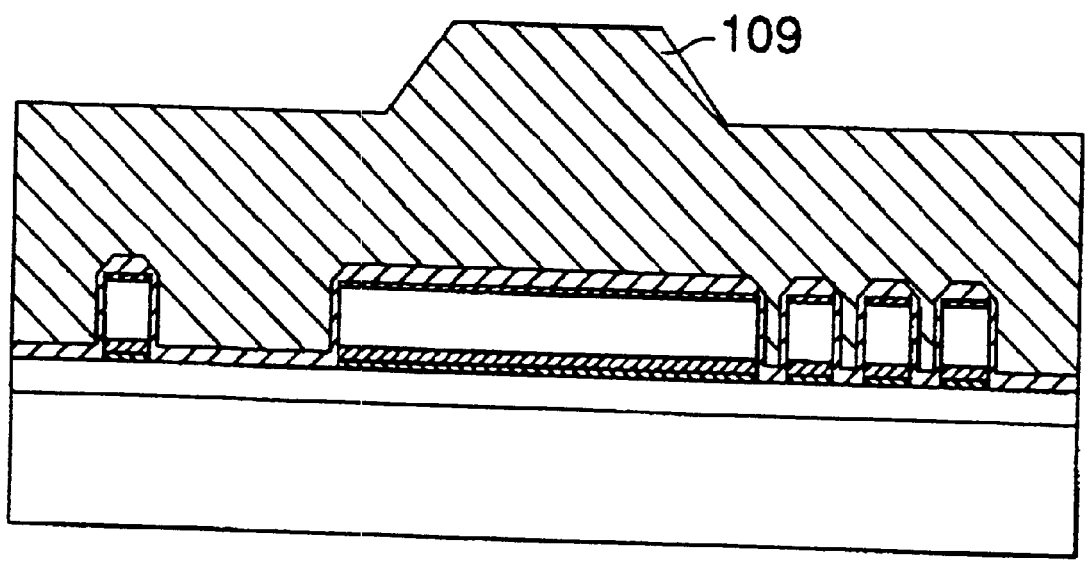

With reference to FIG. 12C, the inductively coupled plasma enhanced chemical vapor deposition system of FIG. 2 is again used to carry out a second high density plasma enhanced chemical vapor deposition to deposit a second silicon dioxide film 109 having a thickness of about 1.9 micrometers on the first silicon dioxide film 108 to bury the gaps between the first level interconnections 107a, 107b, 107c, 107d, and 107e so that the first level interconnections 107a, 107b, 107c, 107d, and 107e are completely buried within the second silicon dioxide film 109. This second high density plasma enhanced chemical vapor deposition is carried out using silane, oxygen and argon gases with application of a low frequency power of 1.8 MHz to the substrate 101. A power of about 3000 W is generated by the high frequency (rf) power source 308 whilst a power of about 1300 kW to be applied to the silicon substrate 101 is generated by the high frequency power source 309. An internal pressure of the chamber is set at about 6 mTorr. A flow rate ratio of oxygen to silane is about 1.4.

Figure 12D:
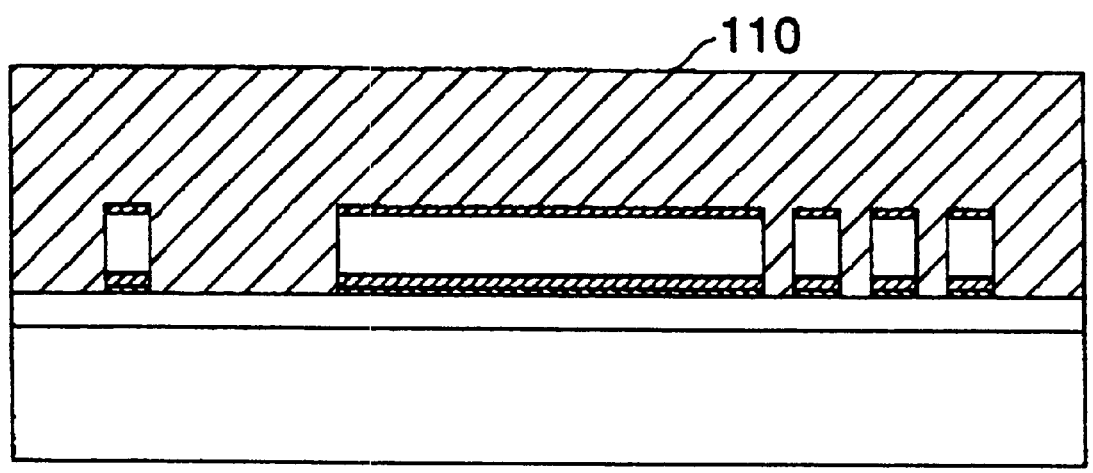

With reference to FIG. 12D, a chemical mechanical polishing method is carried out to polish a surface of the second silicon dioxide film 109 so that a total thickness of the first silicon dioxide film 108 and the second silicon dioxide film 109 over the first level interconnections 107a, 107b, 107c, 107d, and 107e is about 800 manometers, thereby forming a planarized surface of the second silicon dioxide film 109. A heat treatment is carried out at a temperature of about 400 in an nitrogen atmosphere for about 10 minutes to form a surface-planarized inter-layer insulator 110.

Figure 12E:
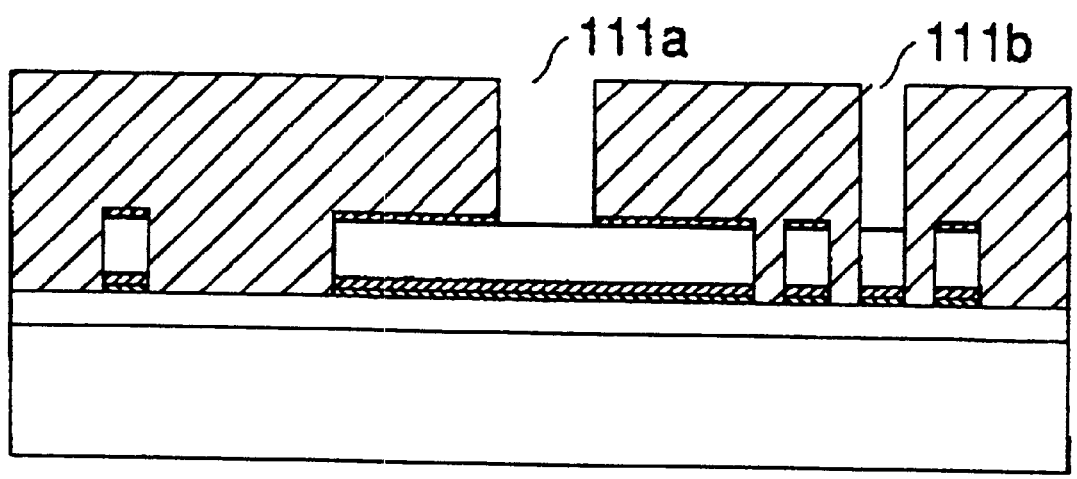

With reference to FIG. 12E, a photo-lithography technique and subsequent dry etching process are carried out to selectively remove the surface-planarized inter-layer insulator 110 and the titanium nitride film 106, thereby to form via holes 111a and 111b in the surface-planarized inter-layer insulator 110 so that the via holes 111a and 111b are positioned over the first level interconnections 107b and 107d respectively, whereby the aluminum-copper alloy film 105 is shown through the via holes 111a and 111b.

Figure 12F:
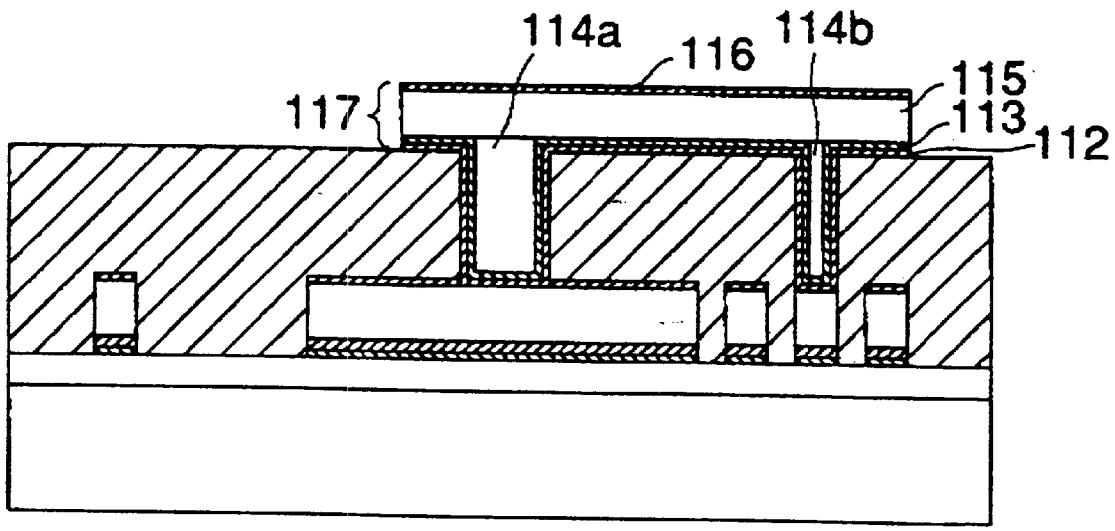

With reference to FIG. 12F, a titanium film 112 is entirely deposited by a sputtering method. Further, a titanium nitride film 113 is also deposited on the titanium film 112 by the sputtering method. A tungsten film is deposited by a chemical vapor deposition method on the titanium nitride film 113 to completely bury the via holes 111a and 111b for subsequent etch back process, whereby tungsten films 114a and 114b are formed only within the via holes 111a and 111b. An aluminum-copper alloy film 115 and a titanium nitride film 116 are deposited by a sputtering method before a photo-lithography technique and subsequent dry etching process are carried out to selectively remove the aluminum-copper alloy film 115 and the titanium nitride film 116 thereby to form second level interconnections 117 which are connected through the tungsten layers 114a and 144b to the first level interconnections 107b and 107d.

Second Embodiment

A second embodiment according to the present invention will be described in detail with reference to FIGS. 13A through 13F which are fragmentary cross sectional elevation views illustrative of a novel method of forming an inter-layer insulator in a multilevel interconnection structure by use of the novel high density plasma enhanced chemical vapor deposition method.

Figure 13A:
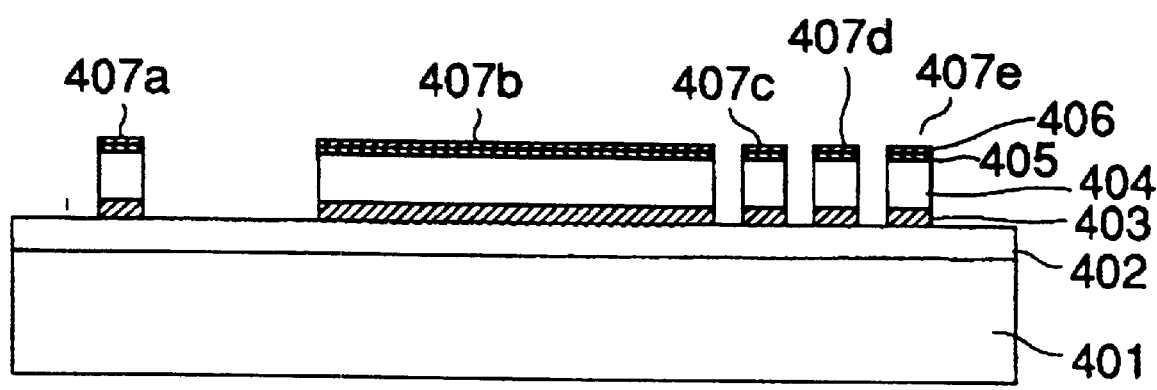
FIGS. 13A through 13F are fragmentary cross sectional elevation views illustrative of a novel method of forming an inter-layer insulator in a multilevel interconnection structure by use of the novel high density plasma enhanced chemical vapor deposition method in a second embodiment.

With reference to FIG. 13A, a boro-phospho-silicate glass film as a base insulating layer is entirely deposited on a surface of a silicon substrate 401 for subsequent curing by a rapid thermal annealing method thereby to form a base insulating film 402 on the silicon substrate 401. Contact holes not illustrated are formed in the base insulating film 402. A titanium nitride film 403 having a thickness of about 80 nanometers is deposited by a sputtering method on a surface of the base insulating film 402. Further, an aluminum-copper alloy film 404 having a thickness of about 450 nanometers is then deposited by the sputtering method on a surface of the titanium nitride film 403. A titanium film 405 having a thickness of about 25 nanometers is deposited by the sputtering method on a surface of the aluminum-copper alloy film 404. A titanium nitride film 406 having a thickness of about 50 nanometers is then deposited by the sputtering method on a surface of the titanium film 405, thereby forming a layered metal film having a thickness of about 605 nanometers on the base insulating film 402. The layered metal film is patterned by the known method to form first level interconnections 407a, 407b, 407c, 407d, and 407e. A minimum space between the adjacent interconnections is 0.28 micrometers. The minimum space has an aspect ratio of 2.2.

Figure 13B:
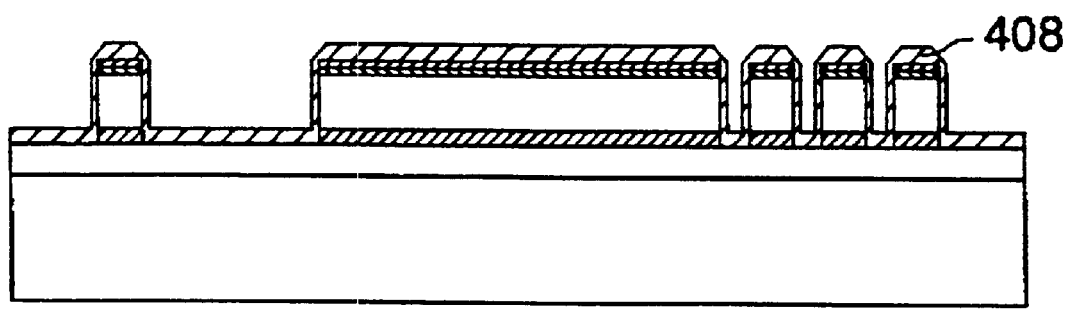

With reference to FIG. 13B, the inductively coupled plasma enhanced chemical vapor deposition system of FIG. 2 is used to carry out a first high density plasma enhanced chemical vapor deposition to deposit a first silicon dioxide film 408 having a thickness of about 70 nanometers on the first level interconnections 407a, 407b, 407c, 407d, and 407e and on the base insulating film 402. This first high density plasma enhanced chemical vapor deposition is carried out using silane, oxygen and argon gases with application of a high frequency power of 13.56 MHz to the substrate 401. A power of about 3500 W is generated by the high frequency power (rf) source 308 whilst a power of about 1500 kW to be applied to the silicon substrate 401 is generated by the high frequency power source 309. An internal pressure of the chamber is set at about 8 mTorr. A flow rate ratio of oxygen to silane is about 1.5. The pedestal 307 is cooled to maintain the substrate temperature at about 400. The deposited first silicon dioxide film 408 has slightly overhang portions at shoulder portions of the first level interconnections 407a, 407b, 407c, 407d, and 407e.

Figure 13C:
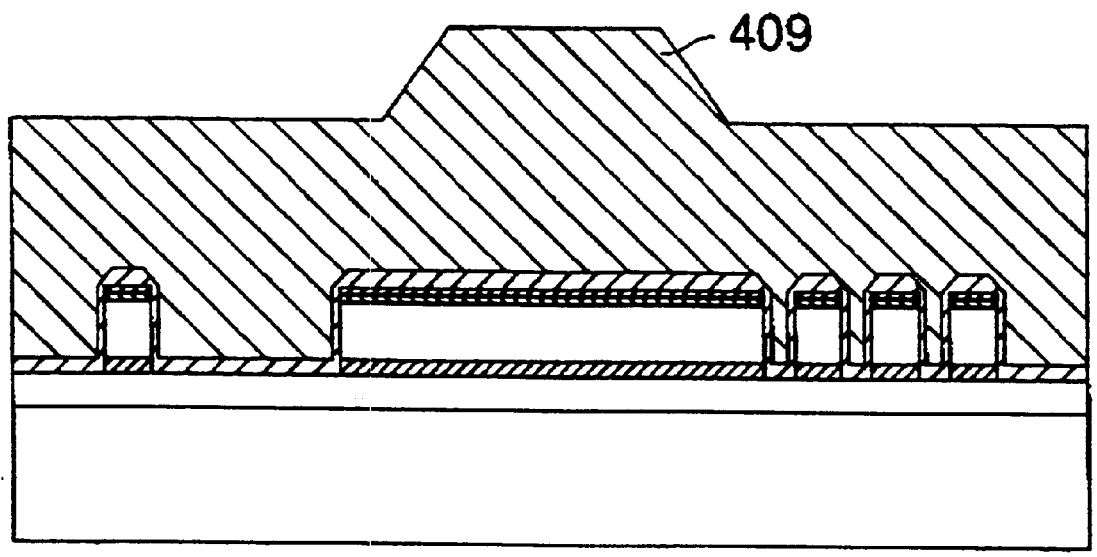

With reference to FIG. 13C, the inductively coupled plasma enhanced chemical vapor deposition system of FIG. 2 is again used to carry out a second high density plasma enhanced chemical vapor deposition to deposit a second fluorine-containing silicon oxide film 409 having a thickness of about 1.7 micrometers on the first silicon dioxide film 408 to bury the gaps between the first level interconnections 407a, 407b, 407c, 407d, and 407e so that the first level interconnections 407a, 407b, 407c, 407d, and 407e are completely buried within the second silicon oxide film 409. This second high density plasma enhanced chemical vapor deposition is carried out using $SiH_4$, $SiF_4$, $O_2$ and Ar gases with application of a low frequency power of 1.8 MHz to the substrate 401. A power of about 3000 W is generated by the high frequency (rf) power source 308 whilst a power of about 1300 kW to be applied to the silicon substrate 401 is generated by the high frequency power source 309. An internal pressure of the chamber is set at about 10 mTorr. A flow rate ratio of $SiF_4$ to $SiH_4$ is about 1. A flow rate ratio of $O_2$ to a total of $SiH_4$ and $SiF_4$ is about 3. The pedestal 307 is cooled to maintain the substrate temperature at about 400. The second fluorine-containing silicon oxide film 409 has a relative dielectric constant of about 3.7.

Figure 13D:
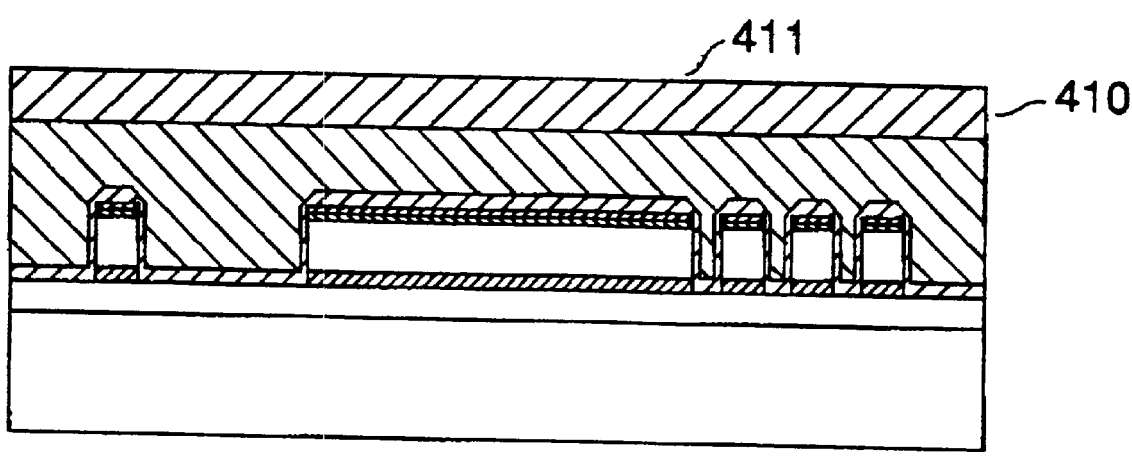

With reference to FIG. 13D, a chemical mechanical polishing method is carried out to polish a surface of the second fluorine-containing silicon oxide film 409 so that a total thickness of the first silicon dioxide film 408 and the second fluorine-containing silicon oxide film 409 over the first level interconnections 407a, 407b, 407c, 407d, and 407e is about 600 manometers, thereby forming a planarized surface of the second silicon dioxide film 409. A heat treatment is carried out at a temperature of about 400 in an nitrogen atmosphere for about 10 minutes to form a surface-planarized inter-layer insulator 409. Further, a parallel plate plasma enhanced chemical vapor deposition system is used to deposit a silicon dioxide film 410 comprising TEOS and $O_2$ having a thickness of about 200 nanometers on the surface-planarized inter-layer insulator 409, thereby forming an inter-layer insulator 411 which comprises layers of the silicon dioxide film 408, the fluorine-containing silicon oxide film 409 and the silicon dioxide film 410.

Figure 13E:
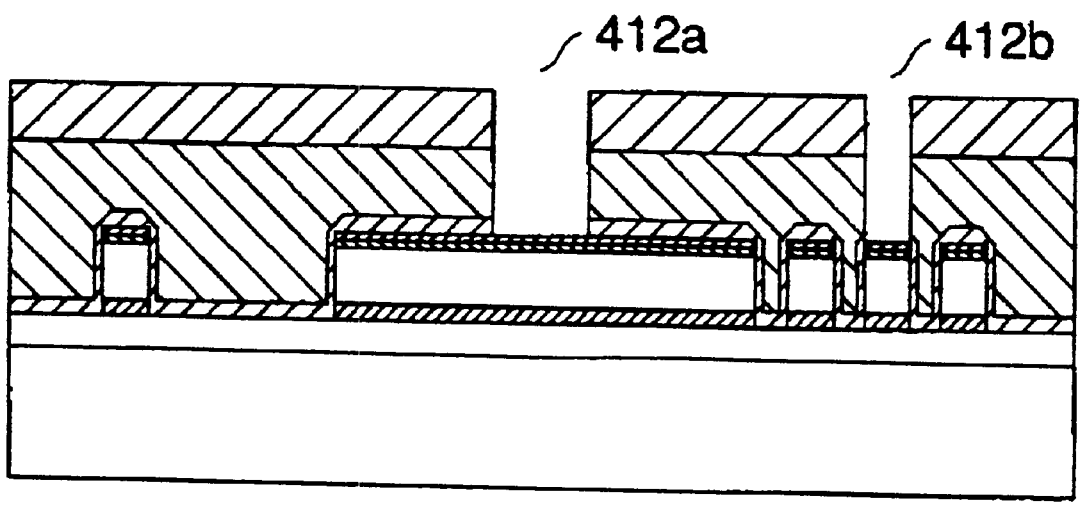

With reference to FIG. 13E, a photo-lithography technique and subsequent dry etching process are carried out to selectively remove the surface-planarized inter-layer insulator 411, wherein the titanium nitride film 406 serves as an etching stopper, thereby to form via holes 412a and 412b in the surface-planarized inter-layer insulator 411 so that the via holes 412a and 412b are positioned over the first level interconnections 407b and 407d respectively.

Figure 13F:
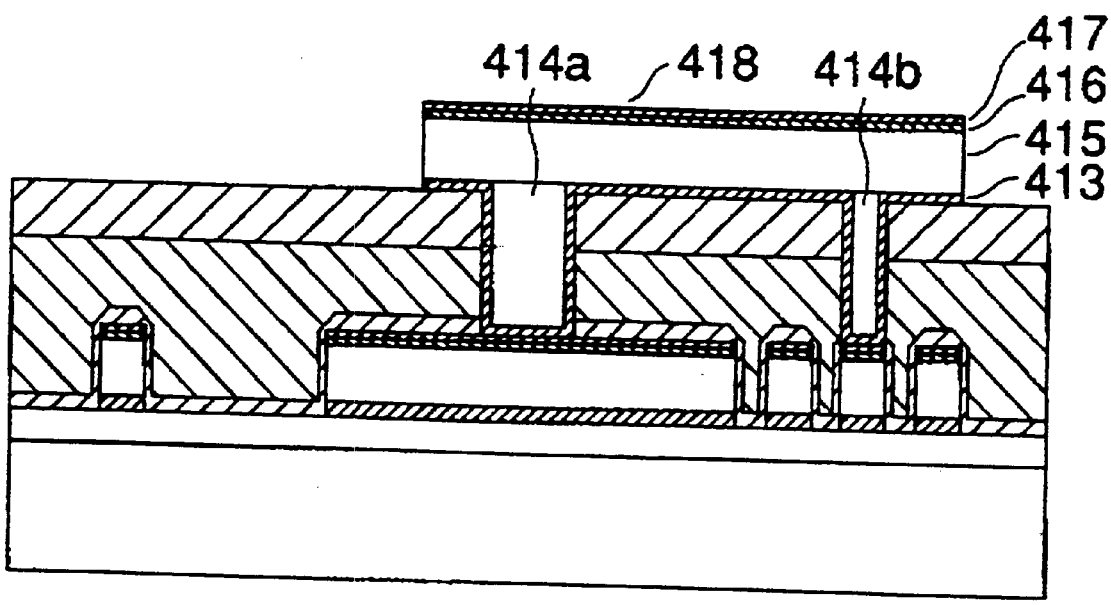

With reference to FIG. 13F, a titanium nitride film 413 is entirely deposited by the sputtering method. A tungsten film is deposited by a chemical vapor deposition method on the titanium nitride film 413 to completely bury the via holes 412a and 411b for subsequent etch back process, whereby tungsten films 414a and 414b are formed only within the via holes 412a and 412b. An aluminum-copper alloy film 415, a titanium film 416 and a titanium nitride film 417 are deposited by a sputtering method before a photo-lithography technique and subsequent dry etching process are carried out to selectively remove the aluminum-copper alloy film 415, the titanium film 416 and the titanium nitride film 417 and 413 thereby to form second level interconnections 418 which are connected through the tungsten layers 414a and 414b to the first level interconnections 407b and 407d.

Third Embodiment

A third embodiment according to the present invention will be described in detail with reference to FIGS. 14A through 14E which are fragmentary cross sectional elevation views illustrative of a novel method of forming a passivation in a multilevel interconnection structure by use of the novel high density plasma enhanced chemical vapor deposition method.

Figure 14A:
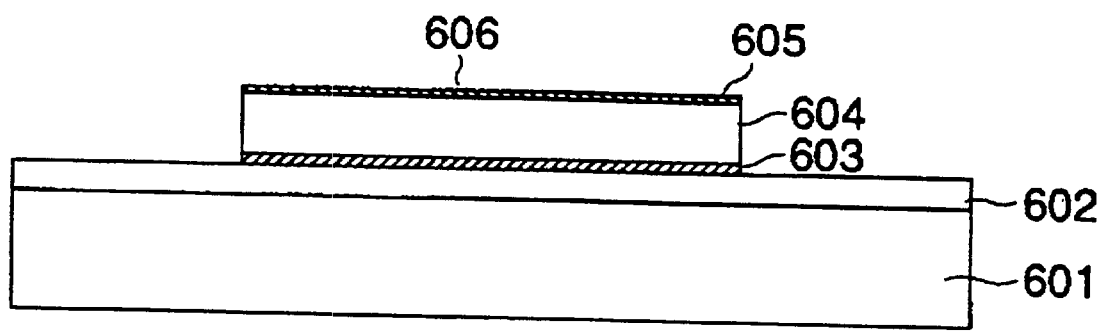
FIGS. 14A through 14E are fragmentary cross sectional elevation views illustrative of a novel method of forming a passivation in a multilevel interconnection structure by use of the novel high density plasma enhanced chemical vapor deposition method in a third embodiment.

With reference to FIG. 14A, a boro-phospho-silicate glass film as a base insulating layer is entirely deposited on a surface of a silicon substrate 601 for subsequent curing by a rapid thermal annealing method thereby to form a base insulating film 602 on the silicon substrate 601. Via holes not illustrated are formed in the base insulating film 602. A titanium film 603 having a thickness of about 80 nanometers is deposited by a sputtering method on a surface of the base insulating film 602. An aluminum-copper alloy film 604 having a thickness of about 450 nanometers is then deposited by the sputtering method on a surface of the titanium film 603. A titanium nitride film 605 having a thickness of about 50 nanometers is then deposited by the sputtering method on a surface of the aluminum-copper alloy film 604, thereby forming a layered metal film having a thickness of about 580 nanometers on the base insulating film 602. The layered metal film is patterned by the known method to form a first level interconnection 606.

Figure 14B:
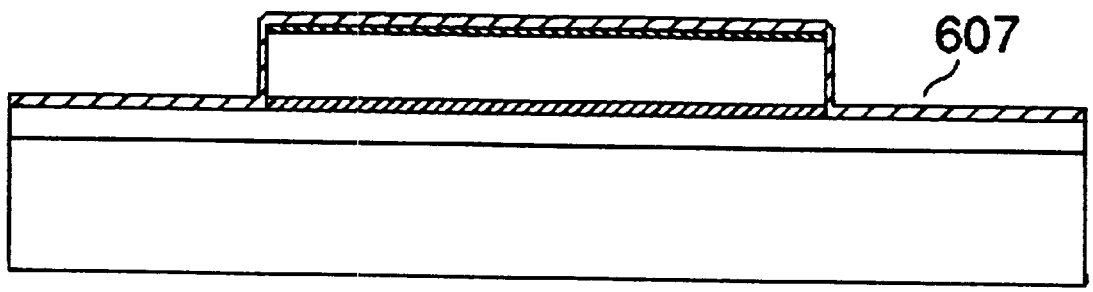

With reference to FIG. 14B, the inductively coupled plasma enhanced chemical vapor deposition system of FIG. 2 is used to carry out a first high density plasma enhanced chemical vapor deposition to deposit a first silicon dioxide film 607 having a thickness of about 70 nanometers on the interconnection 606 and on the base insulating film 602. This first high density plasma enhanced chemical vapor deposition is carried out using silane, oxygen and argon gases with application of a high frequency power of 13.56 MHz to the substrate 601. A power of about 3000 W is generated by the high frequency (rf) power source 308 whilst a power of about 1300 kW to be applied to the silicon substrate 601 is generated by the high frequency power source 309. An internal pressure of the chamber is set at about 6 mTorr. A flow rate ratio of oxygen to silane is about 1.4. The pedestal 307 is cooled to maintain the substrate temperature at about 350. The deposited first silicon dioxide film 608 has slightly overhang portions at shoulder portions of the interconnection 606.

Figure 14C:
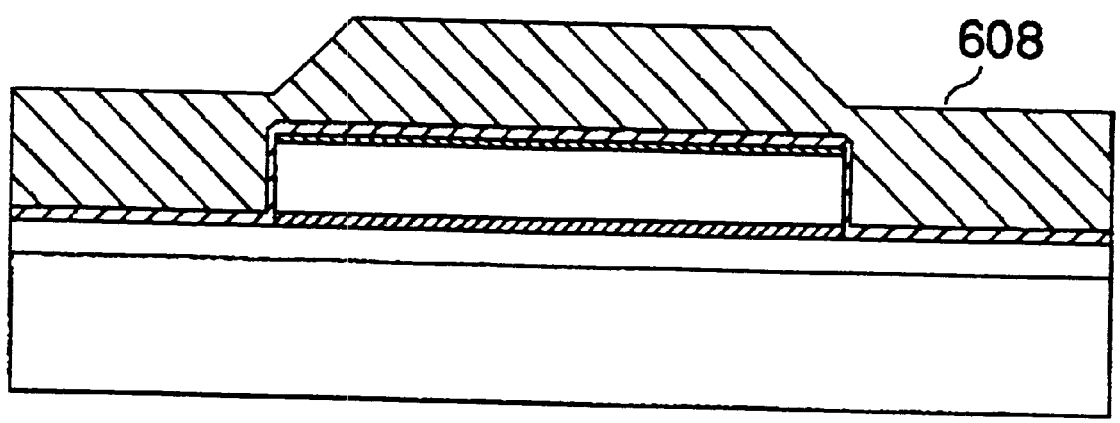

With reference to FIG. 14C, the inductively coupled plasma enhanced chemical vapor deposition system of FIG. 2 is again used to carry out a second high density plasma enhanced chemical vapor deposition to deposit a second silicon dioxide film 608 having a thickness of about 800 nanometers on the first silicon dioxide film 607 so that the first level interconnection 606 is completely buried within the second silicon dioxide film 608. This second high density plasma enhanced chemical vapor deposition is carried out using silane, oxygen and argon gases with application of a low frequency power of 1.8 MHz to the substrate 601. A power of about 3000 W is generated by the high frequency power source 308 whilst a power of about 1300 kW to be applied to the silicon substrate 601 is generated by the high frequency power (rf) source 309. An internal pressure of the chamber is set at about 6 mTorr. A flow rate ratio of oxygen to silane is about 1.4.

Figure 14D:
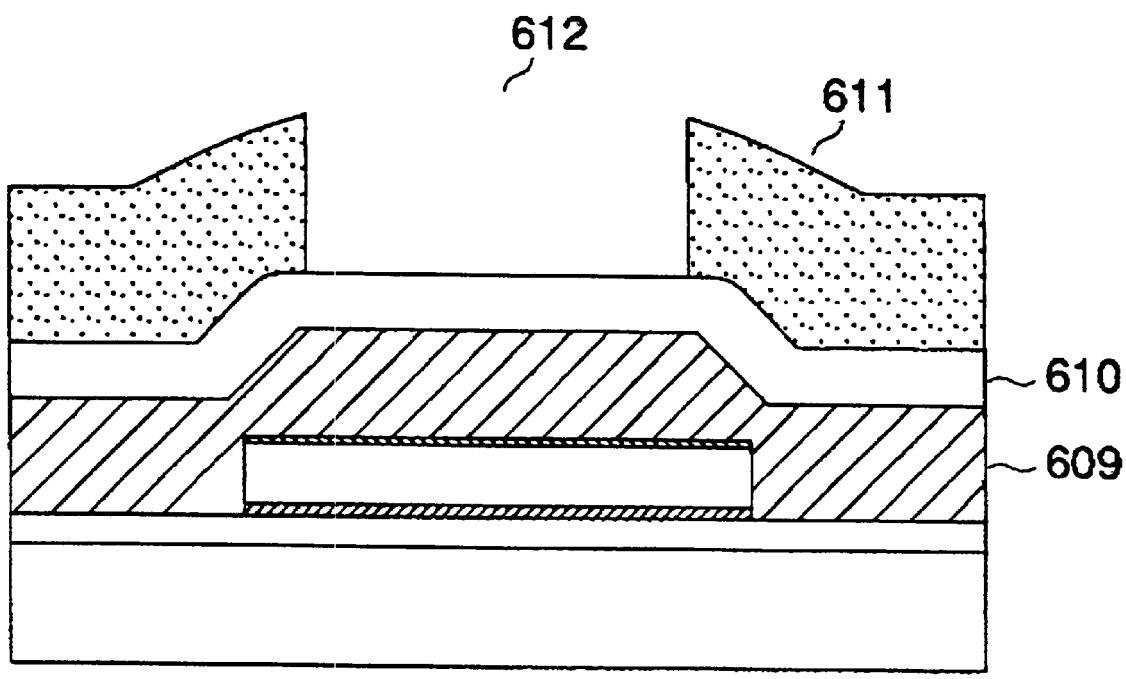

With reference to FIG. 14D, a heat treatment is carried out at a temperature of about 400 in a hydrogen-containing nitrogen atmosphere for 20 minutes to make the first silicon dioxide film 607 and the second silicon dioxide film 608 into a silicon dioxide film 309. A parallel plate plasma enhanced chemical vapor deposition system is used with source gases of silane with 20%-diluted with nitrogen, ammonium and oxide dinitride (N2O) to deposit a silicon oxynitride film 610 having a thickness of about 300 nanometers on the silicon dioxide film 609. A photo-sensitive polyimide film 611 is entirely coated on the silicon oxide dinitride film 610. A photo-lithography is carried out to form an opening 612 in the photo-sensitive polyimide film 611.

Figure 14E:
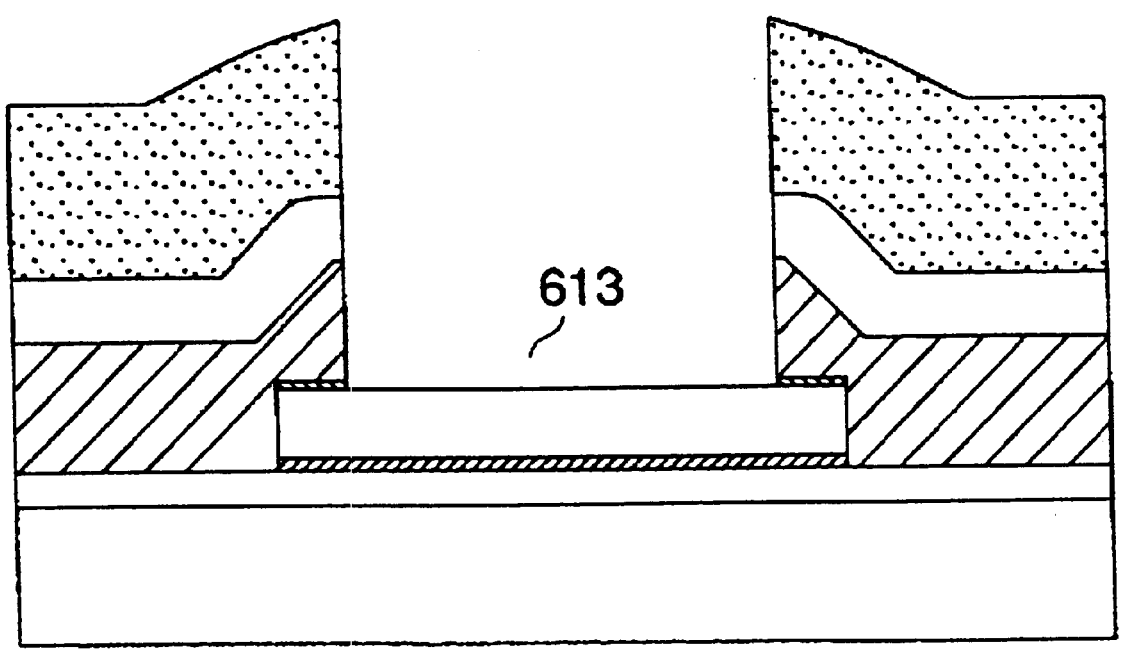

With reference to FIG. 14E, the polyimide film 611 is used as a mask for carrying out a dry etching process to selectively remove the laminations of the silicon oxynitride film 610, the silicon dioxide film 609 and the titanium nitride film 605 to form an opening 613 over the interconnection 606. The laminations 609, 610 and 611 serve as a passivation film.

In the foregoing embodiments, the second high density plasma enhanced chemical vapor deposition was carried out by applying the low frequency power of 1.8 MHz to the substrate. It is, of course, possible to apply the lower frequency power of, for example, 400 kHz to the substrate for further improvement in gap filling of the CVD silicon dioxide film. In this case, the first silicon dioxide film having a thickness of not less than about 500 nanometers is deposited by the first high density plasma enhanced chemical vapor deposition method with applying the high frequency power of 13.56 MHz to the substrate.

In the foregoing embodiments, the first and second high density plasma enhanced chemical vapor depositions were carried out in the same chamber. It is, of course, possible to carry out the first and second high density plasma enhanced chemical vapor depositions in separate or different chambers.

Further, it is, of course, preferable that if the space between the interconnections is relatively large whilst the aspect ratio of the gaps between the interconnections is relatively small, then the second high density plasma enhanced chemical vapor deposition is carried out at a possible high frequency power application, for example, 13.56 Mhz which is the same as in the first high density plasma enhanced chemical vapor deposition.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A high density plasma enhanced chemical vapor deposition method for depositing an insulating film on a silicon region, wherein said plasma enhanced chemical vapor deposition method includes at least both a first deposition period during which a first power having a first frequency is applied to said silicon region and a second deposition period during which a second power having a second frequency which is lower than said first frequency is applied to said silicon region, said second deposition period directly following said first deposition period without any time interval, so that said first frequency is switched to said second frequency during a continuous deposition process, and whereby said first deposition period deposits a first insulating film with a reduced surface state and said second deposition period subsequently deposits on said first insulating film a second insulating film having a high gap filling property.

2. The high density plasma enhanced chemical vapor deposition method as claimed in claim 1, wherein said first deposition period corresponds to an initial deposition period of said high density plasma enhanced chemical vapor deposition method.

3. The high density plasma enhanced chemical vapor deposition method as claimed in claim 2, wherein said first frequency is 13.56 MHz.

4. The high density plasma enhanced chemical vapor deposition method as claimed in claim 3, wherein said second frequency is not higher than 1.8 MHz.

5. The high density plasma enhanced chemical vapor deposition method as claimed in claim 4, wherein a plurality of interconnections are formed on an insulating film on a surface of said silicon region with gaps in the range of 0.2 micrometers to 0.5 micrometers having a maximum aspect ratio in the range of 1.0 to 3.0 between two adjacent said interconnections.

6. The high density plasma enhanced chemical vapor deposition method as claimed in claim 1, wherein said silicon region comprises a silicon substrate.

7. The high density plasma enhanced chemical vapor deposition method as claimed in claim 1, wherein said insulating film is silicon dioxide film.

* * * * *